(12) United States Patent
Hung et al.

(10) Patent No.: US 11,637,054 B2
(45) Date of Patent: Apr. 25, 2023

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Shih-Ting Hung, New Taipei (TW); Meng-Liang Lin, Hsinchu (TW); Shin-Puu Jeng, Hsinchu (TW); Yi-Wen Wu, New Taipei (TW); Po-Yao Chuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 6 days.

(21) Appl. No.: 17/010,849

(22) Filed: Sep. 3, 2020

(65) Prior Publication Data

US 2021/0242117 A1    Aug. 5, 2021

Related U.S. Application Data

(60) Provisional application No. 62/968,153, filed on Jan. 31, 2020.

(51) Int. Cl.
*H01L 21/00*    (2006.01)
*H01L 23/48*    (2006.01)
(Continued)

(52) U.S. Cl.
CPC .... *H01L 23/49822* (2013.01); *H01L 21/4857* (2013.01); *H01L 21/56* (2013.01);
(Continued)

(58) Field of Classification Search
CPC ........... H01L 23/49822; H01L 21/4857; H01L 21/56; H01L 24/16; H01L 24/81
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Nicholas J Tobergte
(74) *Attorney, Agent, or Firm* — JCIPRNET

(57) ABSTRACT

A semiconductor package and a method of manufacturing the same are provided. The semiconductor package includes a semiconductor die, an encapsulant and a redistribution structure. The encapsulant laterally encapsulates the semiconductor die. The redistribution structure is disposed on the encapsulant and electrically connected with the semiconductor die, wherein the redistribution structure comprises a first conductive via, a first conductive wiring layer and a second conductive via stacked along a stacking direction, the first conductive via has a first terminal surface contacting the first conductive wiring layer, the second conductive via has a second terminal surface contacting the first conductive wiring layer, an area of a first cross section of the first conductive via is greater than an area of the first terminal surface of the first conductive via, and an area of a second cross section of the second conductive via is greater than an area of the second terminal surface of the second conductive via.

20 Claims, 11 Drawing Sheets

(51) Int. Cl.
   *H01L 23/498* (2006.01)
   *H01L 23/00* (2006.01)
   *H01L 23/31* (2006.01)
   *H01L 21/48* (2006.01)
   *H01L 21/683* (2006.01)
   *H01L 21/56* (2006.01)
   *H01L 25/16* (2023.01)

(52) U.S. Cl.
   CPC ...... *H01L 21/6835* (2013.01); *H01L 23/3185* (2013.01); *H01L 23/49816* (2013.01); *H01L 24/16* (2013.01); *H01L 24/81* (2013.01); *H01L 25/16* (2013.01); *H01L 2221/68345* (2013.01); *H01L 2224/81815* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0138935 A1* | 6/2008 | Pu | H01L 24/97 257/E21.705 |
| 2013/0001797 A1* | 1/2013 | Choi | H01L 25/105 257/774 |
| 2013/0154108 A1* | 6/2013 | Lin | H01L 24/03 257/774 |
| 2017/0278812 A1* | 9/2017 | Lee | H01L 23/3114 |
| 2018/0053732 A1* | 2/2018 | Baek | H01L 23/5389 |
| 2019/0096824 A1* | 3/2019 | Hur | H01L 23/562 |
| 2019/0122977 A1* | 4/2019 | Park | H01L 24/19 |
| 2020/0020638 A1* | 1/2020 | Heo | H01L 23/5386 |
| 2020/0035591 A1* | 1/2020 | Hu | G01R 3/00 |
| 2020/0118959 A1* | 4/2020 | Kim | H01L 24/19 |
| 2020/0126924 A1* | 4/2020 | Lee | H01L 24/20 |

* cited by examiner

SEMICONDUCTOR PACKAGE AND METHOD OF MANUFACTURING THE SAME

CROSS-REFERENCE TO RELATED APPLICATION

This application claims the priority benefit of U.S. provisional application Ser. No. 62/968,153, filed on Jan. 31, 2020. The entirety of the above-mentioned patent application is hereby incorporated by reference herein and made a part of this specification.

BACKGROUND

The semiconductor industry has experienced rapid growth due to continuous improvements in the integration density of a variety of electronic devices (e.g., transistors, diodes, resistors, capacitors, etc.). For the most part, this improvement in integration density has come from repeated reductions in minimum feature size, which allows more devices to be integrated into a given area. As the demand for miniaturization, higher speed and greater bandwidth, as well as lower power consumption and latency has grown recently, there has grown a need for smaller and more creative packaging techniques of semiconductor dies.

DETAILED DESCRIPTION

Figure 1A:
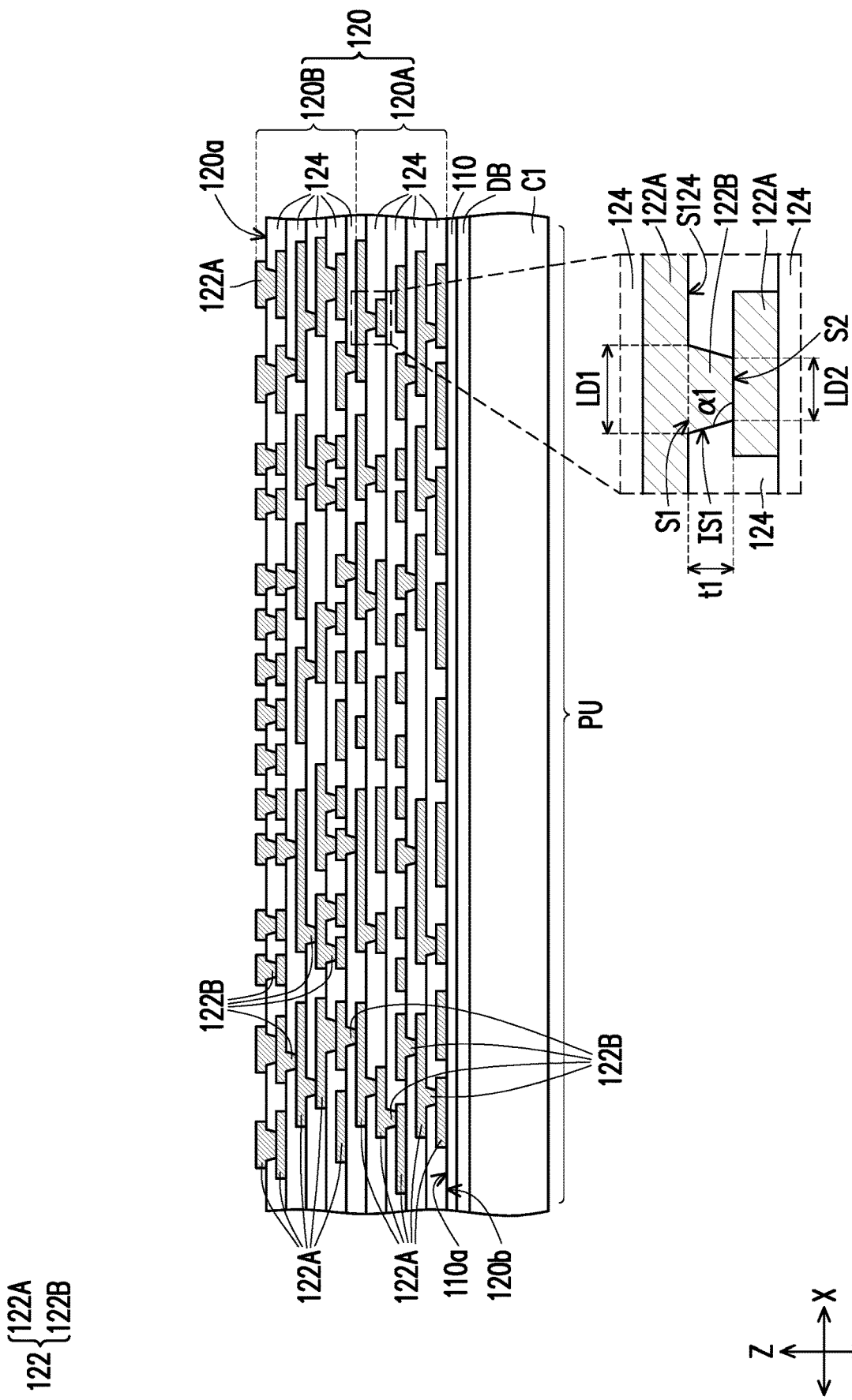
FIG. 1A to FIG. 1I are schematic cross-sectional views illustrating a manufacturing process of a semiconductor package in accordance with some embodiments of the disclosure.

The following disclosure provides many different embodiments, or examples, for implementing different features of the provided subject matter. Specific examples of devices and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views illustrating a manufacturing process of a semiconductor package 10 in accordance with some embodiments of the disclosure. Referring to FIG. 1A, a carrier C1 is provided, and a de-bonding layer DB and a dielectric layer 110 are stacked over the carrier C1 in sequential order. In some embodiments, the carrier C1 is a glass substrate, a metal plate, a plastic supporting board or the like, but other suitable substrate materials may be used as long as the materials are able to withstand the subsequent steps of the process. In some embodiments, the carrier C1 is in wafer form. For example, the carrier C1 has a circular shape. However, the disclosure is not limited thereto. In some alternative embodiments, the carrier is in panel form. For example, the carrier C1 has a rectangular shape. The carrier C1 may be planar in order to accommodate the formation of additional features subsequently formed thereon. In some embodiments, the de-bonding layer DB is formed on the carrier C1 to facilitate peeling the carrier C1 away from the structure when required by the manufacturing process. In some embodiments, the de-bonding layer DB includes a light-to-heat conversion (LTHC) release layer. In some embodiments, the de-bonding layer DB is coated onto carrier C11. In some embodiments, the illustrated top surface of the de-bonding layer DB is leveled and has a high degree of co-planarity. In some embodiments, the material of the dielectric layer 110 includes polymer, such as polyimide (PI), benzocyclobutene (BCB), or polybenzoxazole (PBO). In some alternative embodiments, the material of the dielectric layer 110 includes non-organic dielectric materials, such as silicon oxide, silicon nitride, silicon carbide, silicon oxynitride, phosphosilicate glass (PSG), borosilicate glass (BSG), or boron-doped phosphosilicate glass (BPSG). In some embodiments, the dielectric layer 110 is formed by suitable fabrication techniques such as spin-on coating, chemical vapor deposition (CVD), high density plasma chemical vapor deposition (HDPCVD), plasma enhanced chemical vapor deposition (PECVD), or atomic layer deposition (ALD).

Continued on FIG. 1A, a redistribution structure 120 is formed over the carrier C1, the de-bonding layer DB and the dielectric layer 110. In some embodiments, the formation of the redistribution structure 120 includes sequentially forming multiple redistribution layers 122 and multiple dielectric layers 124 in alternation. That is to say, the redistribution structure 120 includes multiple redistribution layers 122 and multiple dielectric layers 124 stacked alternately along a direction Z parallel to a normal direction of the carrier C1. In certain embodiments, as shown in FIG. 1A, the redistribution layers 122 are sandwiched between the dielectric layers 124, where portions of the topmost layer of the redistribution layers 122 are located on the topmost layer of the dielectric layers 124 for being connected with one or more overlying connectors (e.g., later-formed conductive connector(s) or semiconductor device(s) such as semiconductor die(s) or passive device(s)), and the bottommost layer of the redistribution layers 122 is exposed by the bottommost layer of the dielectric layers 124 for being connected with one or more connectors (e.g., later-formed conductive via(s)). Moreover, as shown in FIG. 1A, the topmost layer of the redistribution layers 122 protrudes from the illustrated top surface of the topmost layer of the dielectric layers 124, that is, the illustrated top surface of the topmost layer of the redistribution layers 122 is higher than the illustrated top surface of the topmost layer of the dielectric layers 124. However, the disclosure is not limited thereto. In some alternative embodiments, the illustrated top surface of the topmost layer of the redistribution layers 122 may be substantially level with the illustrated top surface of the topmost layer of the dielectric layers 124. Further, as shown in FIG. 1A, the illustrated bottom surface of the bottommost layer of the redistribution layers 122 and the illustrated bottom surface of the bottommost layer of the dielectric layers 124 are substantially level with each other, and are in contact with the dielectric layer 110. It is noted that although ten redistribution layers 122 and nine dielectric layers 124 are illustrated herein, the scope of the disclosure is not limited by the embodiments of the disclosure. In some embodiments, the number of the redistribution layers 122 ranges from 5 to 10. That is to say, during the formation of the redistribution structure 120, 5 to 10 redistribution layers 122 may be formed over the dielectric layer 110.

In some embodiments, the material of the dielectric layers 124 includes polymer, such as PI, BCB, or PBO. In some alternative embodiments, the material of the dielectric layers 124 includes non-organic dielectric materials, such as silicon oxide ($SiO_x$, where x>0), silicon nitride ($SiN_x$, where x>0), silicon carbide, silicon oxynitride ($SiO_xN_y$, where x>0 and y>0), phosphosilicate glass (PSG), borosilicate glass (BSG), or boron-doped phosphosilicate glass (BPSG). In some embodiments, the dielectric layers 124 are formed by suitable fabrication techniques such as spin-on coating, CVD, HDPCVD, PECVD, or ALD.

In some embodiments, the material of the redistribution layers 122 includes a conductive material such as copper, copper alloy, aluminum, aluminum alloy, or combinations thereof. In certain embodiments, the redistribution layers 122 are copper layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. In some embodiments, the redistribution layers 122 are formed by electroplating, deposition, and/or photolithography and etching. In the case that the redistribution layers 122 are formed by electroplating, each of the redistribution layers 122 may include a seed layer (not shown) under the plated conductive material, wherein the seed layer and the plated conductive material may be formed of the same material or different materials.

In some embodiments, each of the redistribution layers 122 includes a conductive wiring layer 122A and one or more conductive vias 122B. In some embodiments, in the redistribution structure 120, the dielectric layers 124 and the conductive wiring layers 122A are stacked alternately along the direction Z, and each of the conductive wiring layers 122A extends horizontally on the surface S124 (illustrated as the top surface in FIG. 1A) of the corresponding dielectric layer 124 along a direction X perpendicular to the direction Z. In some embodiments, the conductive vias 122B are embedded in the dielectric layers 124, and each of the conductive vias 122B extends vertically through the corresponding dielectric layer 124 along the direction Z to establish electrical connection between two conductive wiring layers 122A. That is to say, two conductive wiring layers 122A are electrically connected with each other through the conductive vias 122B sandwiched therebetween. In other words, the conductive wiring layers 122A in the redistribution structure 120 are interconnected with one another through the conductive vias 122B. In some embodiments, each of the conductive wiring layers 122A may include conductive traces (conductive lines), conductive pads or a combination thereof. In certain embodiments, the topmost conductive wiring layer 122A includes multiple conductive pads.

In some embodiments, as shown in FIG. 1A, the cross-sectional shape of the conductive via 122B is inverted trapezoid. That is to say, in the cross-sectional view shown from FIG. 1A, along the direction X, the lateral dimension LD1 of the surface S1 (illustrated as the top surface in FIG. 1A) of the conductive via 122B is larger than the lateral dimension LD2 of the surface S2 (illustrated as the bottom surface in FIG. 1A) of the conductive via 122B. In other words, the lateral dimension of the conductive via 122B decreases from the top of the conductive via 122B to the bottom of the conductive via 122B along the direction Z. In some embodiments, from a top view, the surface S1 and the surface S2 of the conductive via 122B each have a circular shape. In other words, a cross-section of the conductive via 122B parallel to the surface S1 or the surface S2 is a circle. However, the disclosure is not limited thereto. In some alternative embodiments, from a top view, the surface S1 and the surface S2 of the conductive via 122B each may have an elliptical shape, a polygonal shape or other suitable shapes. In the case that the surface S1 and the surface S2 of the conductive via 122B each have a circular top-view shape, then the lateral dimension LD1 and the lateral dimension LD2 each may be the diameter. In the case that the surface S1 and the surface S2 of the conductive via 122B each have a polygonal top-view shape, then the lateral dimension LD1 and the lateral dimension LD2 each may be the maximum dimension. From another point of view, in some embodiments, the conductive via 122B has a shape of an inverted frustum (i.e., an inverted cone or pyramid with the tip truncated). That is to say, the area of the surface S1 of the conductive via 122B is greater than the area of the surface S2 of the conductive via 122B. In other words, as shown in FIG. 1A, the conductive via 122B is tapered toward the dielectric layer 110, the de-bonding layer DB and the carrier C1 along the direction Z. For example, the conductive via 122B may have a shape of an inverted frustum of a cone, an elliptic cone, or a pyramid.

As mentioned above, the conductive via 122B functions as a connector between the overlying conductive wiring layer 122A and the underlying conductive wiring layer 122A along the direction Z, thereby the surface S1 and the surface S2 of the conductive via 122B are in physical and direct contact with the corresponding conductive wiring layers 122A. That is to say, the area of the surface S1 and the area of the surface S2 are referred to as contact areas between the two conductive wiring layers 122A and the conductive via 122B sandwiched there between. In some embodiments, as shown in FIG. 1A, the contact area (i.e., the area of the surface S1) between the conductive via 122B and the overlying conductive wiring layer 122A is greater than the contact area (i.e., the area of the surface S2) between the conductive via 122B and the underlying conductive wiring layer 122A. In some embodiments, as shown in FIG. 1A, the surface S1 of the conductive via 122B is in contact with the conductive wiring layer 122A which is in the same redistribution layer 122 as the said conductive via 122B, and the surface S2 of the conductive via 122B is in contact with the underlying conductive wiring layer 122A which is in the different redistribution layer 122 from the said conductive via 122B. In some embodiments, as shown in FIG. 1A, the surface S1 of the conductive via 122B is substantially coplanar with and flush with the surface S124 of the corresponding dielectric layer 124. In some embodiments, the ratio of the surface S1 to the surface S2 ranges from about 1.2 to about 1.8. With such configuration, the manufacturing process of the semiconductor package 10 can be compatible with the currently-adopted manufacturing process, thereby improving the production yield of the semiconductor package 10.

In some embodiments, the conductive via 122B is formed with an inclined sidewall IS1 connecting with the surface S1 and the surface S2. In some embodiments, an angle α1 between the inclined sidewall IS1 and the surface S2 is an obtuse angle. In some embodiments, the angle α1 is in the range from about 95 degrees to about 110 degrees. With such configuration, the manufacturing process of the semiconductor package 10 can be compatible with the currently-adopted manufacturing process, thereby improving the production yield of the semiconductor package 10. In some embodiments, the thickness t1 of the conductive via 122B is in the range from about 5 μm to about 8 μm. With such configuration, the manufacturing process of the semiconductor package 10 can be compatible with the currently-adopted manufacturing process, thereby improving the production yield of the semiconductor package 10.

In some embodiments, the redistribution structure 120 has a surface 120a and a surface 120b opposite to the surface 120a. As shown in FIG. 1A, the surface 120a of the redistribution structure 120 is illustrated as the top surface, and the surface 120b of the redistribution structure 120 is illustrated as the bottom surface. In some embodiments, the surface 120b faces the carrier C1. In some embodiments, the surface 120b is attached to a surface 110a of the dielectric layer 110. In some embodiments, the surface 120a is constituted by the topmost dielectric layer 124 and the topmost conductive wiring layer 122A, and the surface 120b is constituted by the bottommost dielectric layer 124 and the bottommost conductive wiring layer 122A.

In some embodiments, the redistribution structure 120 is formed to include a coarse-featured portion 120A and a fine-featured portion 120B over the coarse-featured portion 120A along the direction Z. With such configuration, the production cost of the semiconductor package 10 can be reduced. As shown in FIG. 1A, the coarse-featured portion 120A is shown as an example having the first layer through the fifth layer of the redistribution layers 122, and the fine-featured portion 120B is shown as an example having the sixth layer through the tenth layer of the redistribution layers 122. However, the disclosure is not limited thereto, more or fewer redistribution layers 122 may be included in the coarse-featured portion 120A, and more or fewer redistribution layers 122 may be included in the fine-featured portion 120B. In certain embodiments, the fine-featured portion 120B is formed to have the first layer through the nth layer of the redistribution layers 122, and the coarse-featured portion 120A is formed to have the (n+1)th layer through the mth layer of the redistribution layers 122, wherein m>n+1, n represents an integer from 1 to 6, and m represents an integer from 5 to 10. In some embodiments, the dimensions (such as lengths, widths, heights, thicknesses) of the redistribution layers 122 in the coarse-featured portion 120A are greater than the dimensions of the redistribution layers 122 in the fine-featured portion 120B. In such embodiments, the thicknesses of the dielectric layers 124 in the coarse-featured portion 120A are greater than the thicknesses of the dielectric layers 124 in the fine-featured portion 120B. In certain embodiments, the sizes of lines and spaces (L/S) of the redistribution layers 122 in the coarse-featured portion 120A are greater than the sizes of L/S of the redistribution layers 122 in the fine-featured portion 120B. In other words, the pitches of the redistribution layers 122 in the coarse-featured portion 120A are greater than the pitches of the redistribution layers 122 in the fine-featured portion 120B. It is noted that although the redistribution structure 120 is shown as an example divided into two portions (i.e., the coarse-featured portion 120A and the fine-featured portion 120B), the scope of the disclosure is not limited thereof. In some alternative embodiments, the redistribution structure 120 may be formed to include only the fine-featured portion 120B. In some alternative embodiments, the redistribution structure 120 may be formed to include only the coarse-featured portion 120A.

Figure 1B:
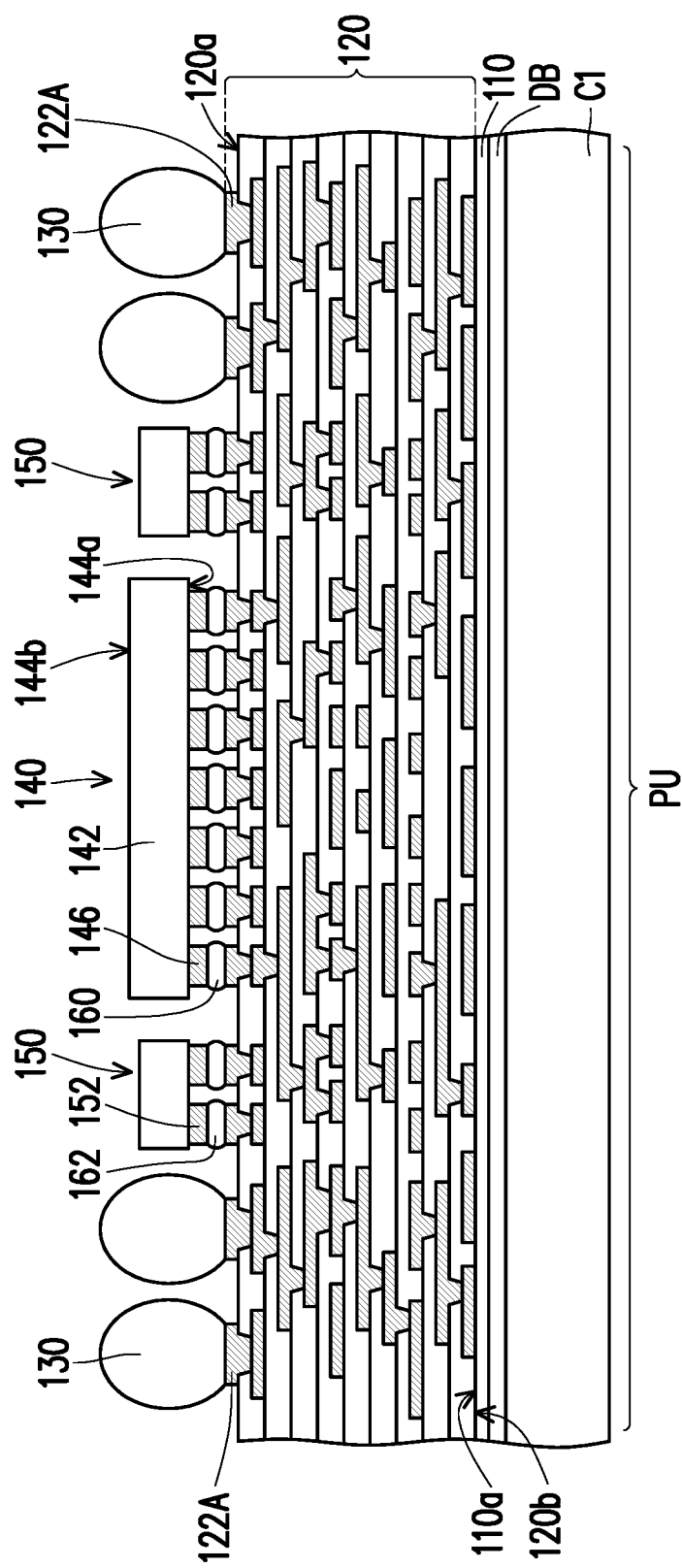

Referring to FIG. 1B, after forming the redistribution structure 120, at least one semiconductor die 140, at least one passive device 150 and a plurality of conductive connectors 130 are provided over the surface 120a of the redistribution structure 120. That is to say, the surface 120a faces the at least one semiconductor die 140. In some embodiments, the conductive connectors 130 are formed on the topmost conductive wiring layer 122A. In some embodiments, the conductive connectors 130 are attached to the topmost conductive wiring layer 122A through a solder flux. In some embodiments, the conductive connectors 130 are solder balls or ball grid array (BGA) balls. In such case, the conductive connectors 130 are referred to as conductive balls. In some embodiments, the conductive connectors 130 are formed through a ball placement process and/or a reflowing process. In certain embodiments, the conductive connectors 130 are formed on the conductive pads included in the topmost conductive wiring layer 122A. In such embodiments, the said conductive pads are referred to as under-ball metallurgy patterns for ball mount. The number of the conductive connectors 130 is not limited according to the disclosure, and may be selected based on the demand.

Continued on FIG. 1B, at least one semiconductor die 140 and at least one passive device 150 are picked and placed on the topmost conductive wiring layer 122A. Although FIG. 1B illustrates that one semiconductor die 140 and two passive devices 150 are placed on the topmost conductive wiring layer 122A in one packaging unit PU, it should be noted that the number of the semiconductor die 140 and the number of the passive devices 150 placed on the topmost conductive wiring layer 122A in one packaging unit PU are not limited thereto, and can be adjusted based on demand and/or design layout. Also, in the cross-sectional views shown from FIG. 1A to FIG. 1I, one packaging unit PU is shown for simplicity, but the disclosure is not limited by the embodiments or figures shown herein, those skilled in the art can understand that more than one packaging unit PU arranged in an array are provided on the carrier C. In some embodiments, when more than one semiconductors die 140 are placed on the topmost conductive wiring layer 122A, the semiconductor dies 140 may be arranged in an array, and when the semiconductor dies 140 are arranged in an array, the conductive connectors 130 may be classified into groups. The number of the semiconductor dies 140 may correspond to the number of groups of the conductive connectors 130. In some embodiments, when more than one semiconductors die 140 are placed on the topmost conductive wiring layer 122A, the semiconductor dies 140 have the same function and property. In some alternative embodiments, when more than one semiconductors die 140 are placed on the topmost conductive wiring layer 122A, the semiconductor dies 140 have different functions and properties. In the exemplary embodiment, the semiconductor die 140 and the passive devices 150 are picked and placed on the topmost conductive wiring layer 122A after the formation of the conductive connectors 130. However, the disclosure is not limited thereto. In some alternative embodiments, the semiconductor die 140 and the passive devices 150 may be picked and placed on the topmost conductive wiring layer 122A before the formation of the conductive connectors 130. In some embodiments, the semiconductor die 140 is bonded and connected with the topmost conductive wiring layer 122A though a plurality of solder regions 160, and the passive device 150 is bonded and connected with the topmost conductive wiring layer 122A though a plurality of solder regions 162. In some embodiments, the solder region 160 and the solder region 162 respectively include solder material. In some embodiments, the solder region 160 and the solder region 162 respectively are made of a conductive material with low resistivity, such as Sn, Pb, Ag, Cu, Ni, Bi, or an alloy thereof. In some embodiments, the solder region 160 and the solder region 162 respectively are formed through evaporation, electroplating, printing, solder transfer, ball placement, a reflowing process, or combinations thereof.

In some embodiments, the semiconductor die 140 may be a digital chip, an analog chip or a mixed signal chip. In some embodiments, the semiconductor die 140 may be an application-specific integrated circuit ("ASIC") chip, a sensor chip, a wireless and radio frequency chip, a memory chip, a logic chip, a voltage regulator chip or any other suitable chip. In certain embodiments, the semiconductor die 140 is a system on chip (SoC). In some embodiments, the semiconductor die 140 includes a substrate 142, an active surface 144a, a rear surface 144b opposite to the active surface 144a, and a plurality of conductive connectors 146 distributed on the active surface 144a. In some embodiments, the substrate 142 is a semiconductor substrate which is made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor die 140 may include a device layer (not shown) formed in or on the substrate 142. In some embodiments, the said device layer includes active devices (e.g., transistors and/or memories such as N-type metal-oxide semiconductor (NMOS) and/or P-type metal-oxide semiconductor (PMOS) devices, or the like) and optionally passive devices (e.g., resistors, capacitors, inductors or the like). In some embodiments, the conductive connectors 146 are conductive pillars, conductive posts or conductive pads. In certain embodiments, the conductive connectors 146 are copper pillars or other suitable conductive pillars. In some embodiments, the semiconductor die 140 may include conductive patterns or traces (not shown) in or on the substrate 142, and the conductive patterns or traces may be electrically connected with the conductive connectors 146.

In some embodiments, the semiconductor die 140 is bonded and connected with the topmost conductive wiring layer 122A though the conductive connectors 146 and the solder regions 160. In some embodiments, before placing the semiconductor die 140 onto the topmost conductive wiring layer 122A, the solder regions 160 are formed on the conductive connectors 146 respectively. In such case, the semiconductor die 140 is placed such that the solder regions 160 are attached to the topmost conductive wiring layer 122A, and once the solder regions 160 and the topmost conductive wiring layer 122A are in physical contact, a reflow process is performed to bond the solder regions 160 and the topmost conductive wiring layer 122A and thus attach the semiconductor die 140 to the redistribution structure 120. In alternative some embodiments, before placing the semiconductor die 140 onto the topmost conductive wiring layer 122A, the solder regions 160 are formed on the topmost conductive wiring layer 122A. In such case, the semiconductor die 140 is placed such that the conductive connectors 146 are attached to the corresponding solder regions 160 on the topmost conductive wiring layer 122A, and once the conductive connectors 146 and the solder regions 160 are in physical contact, a reflow process is performed to bond the conductive connectors 146 and the solder regions 160 and thus attach the semiconductor die 140 to the redistribution structure 120. In some embodiments, after performing the reflow process, the solder regions 160 connected with the conductive connectors 146 reshape into the desired bump shapes. In some embodiments, the conductive connectors 146 and the solder regions 160 are collectively referred to as micro bumps. In other words, the semiconductor die 140 is bonded onto the topmost conductive wiring layer 122A through bump joints. By such configuration, the bonding strength between the semiconductor die 140 and the redistribution structure 120 is strong enough to facilitate releasing the stress resulted from coefficient of thermal expansion (CTE) mismatch between the carrier C1 and the dielectric layer 110 as well as the dielectric layers 124 of the redistribution structure 120. In some embodiments, a solder flux (not shown) may be applied onto the solder regions 160 for better adhesion. In certain embodiments, the solder regions 160 are disposed on and in direct contact with the conductive pads included in the topmost conductive wiring layer 122A. In such embodiments, the said conductive pads are referred to as under-bump metallurgy patterns for bump bonding. In some embodiments, as shown in FIG. 1B, the solder regions 160 are located between the conductive connectors 146 of the semiconductor die 140 and the conductive pads included in the topmost conductive wiring layer 122A. However, the disclosure is not limited thereto. In some alternative embodiments, the solder regions 160 may further covers a portion of sidewalls of the conductive connectors 146 and a portion of sidewalls of the conductive pads included in topmost conductive wiring layer 122A. The number of the conductive connectors 146 and the number of the solder regions 160 are not limited according to the disclosure, and may be selected based on the demand.

In some embodiments, as shown in FIG. 1B, after the semiconductor die 140 is bonded to the topmost conductive wiring layer 122A, the active surface 144a of the semiconductor die 140 faces the surface 120a of the redistribution structure 120. That is to say, the semiconductor die 140 is bonded to the topmost conductive wiring layer 122A by using flip-chip bonding. In some embodiments, as shown in FIG. 1B, after the semiconductor die 140 is bonded to the topmost conductive wiring layer 122A, sidewalls of the conductive connectors 146 are exposed. However, the disclosure is not limited thereto. In some alternative embodiments, the semiconductor die 140 may further include an insulating layer disposed on the active surface 144a, and the conductive connectors 146 may be embedded in the insulating layer, that is, the insulating layer surrounds and covers the sidewalls of the connectors 146.

In some embodiments, the passive device 150 may be a capacitor, a resistor, an inductor, a fuse or the like. In some embodiments, the passive device 150 includes a plurality of conductive connectors 152, and the passive device 150 is bonded and connected with the topmost conductive wiring layer 122A through the conductive connectors 152 and the solder regions 162. In some embodiments, before placing the passive device 150 onto the topmost conductive wiring layer 122A, the solder regions 162 are formed on the conductive connectors 152 respectively. In such case, the passive device 150 is placed such that the solder regions 162 are attached to the topmost conductive wiring layer 122A, and once the solder regions 162 and the topmost conductive wiring layer 122A are in physical contact, a reflow process is performed to bond the solder regions 162 and the topmost conductive wiring layer 122A and thus attach the passive device 150 to the redistribution structure 120. In alternative some embodiments, before placing the passive device 150 onto the topmost conductive wiring layer 122A, the solder regions 162 are formed on the topmost conductive wiring layer 122A. In such case, the passive device 150 is placed such that the conductive connectors 152 are attached to the corresponding solder regions 162 on the topmost conductive wiring layer 122A, and once the conductive connectors 152 and the solder regions 162 are in physical contact, a reflow process is performed to bond the conductive connectors 152 and the solder regions 162 and thus attach the passive device 150 to the redistribution structure 120. In some embodiments, after performing the reflow process, the solder regions 162 connected with the conductive connectors 152 reshape into the desired bump shapes. In some embodiments, the conductive connectors 152 and the solder regions 162 are collectively referred to as micro bumps. In other words, the passive device 150 is bonded onto the topmost conductive wiring layer 122A through bump joints. In some embodiments, a solder flux (not shown) may be applied onto the solder regions 162 for better adhesion. In certain embodiments, the solder regions 162 are disposed on and in direct contact with the conductive pads included in the topmost conductive wiring layer 122A. In such embodiments, the said conductive pads are referred to as under-bump metallurgy patterns for bump bonding. In some embodiments, as shown in FIG. 1B, the solder regions 162 are located between the conductive connectors 152 of the passive device 150 and the conductive pads included in the topmost conductive wiring layer 122A. However, the disclosure is not limited thereto. In some alternative embodiments, the solder regions 162 may further covers a portion of sidewalls of the conductive connectors 152 and a portion of sidewalls of the conductive pads included in topmost conductive wiring layer 122A. The number of the conductive connectors 152 and the number of the solder regions 162 are not limited according to the disclosure, and may be selected based on the demand. In some embodiments, as shown in FIG. 1B, after the passive device 150 is bonded to the topmost conductive wiring layer 122A, sidewalls of the conductive connectors 152 are exposed. However, the disclosure is not limited thereto. In some alternative embodiments, the passive device 150 may further include an insulating layer surrounding and covering the sidewalls of the connectors 152.

Referring to FIG. 1A and FIG. 1B, the redistribution structure 120 is formed prior to the placement of the semiconductor die 140, and thus the foregoing process is considered as a "RDL first method." By adopting the RDL first method to form the redistribution structure 120 and the semiconductor die 140 over the carrier C1, the subsequently formed semiconductor package 10 can be formed without being constrained by the fan-out ratio (i.e., the ratio of die area to package area). Moreover, since the semiconductor die 140 is coupled to the surface 120a of the redistribution structure 120 through flip-chip bonding, a die attach film (DAF) or a film on wire (FOW) utilized in conventional package structures for adhering the semiconductor die is eliminated. As a result, an overall thickness of the subsequently formed semiconductor package 10 may be effectively reduced.

Figure 1C:
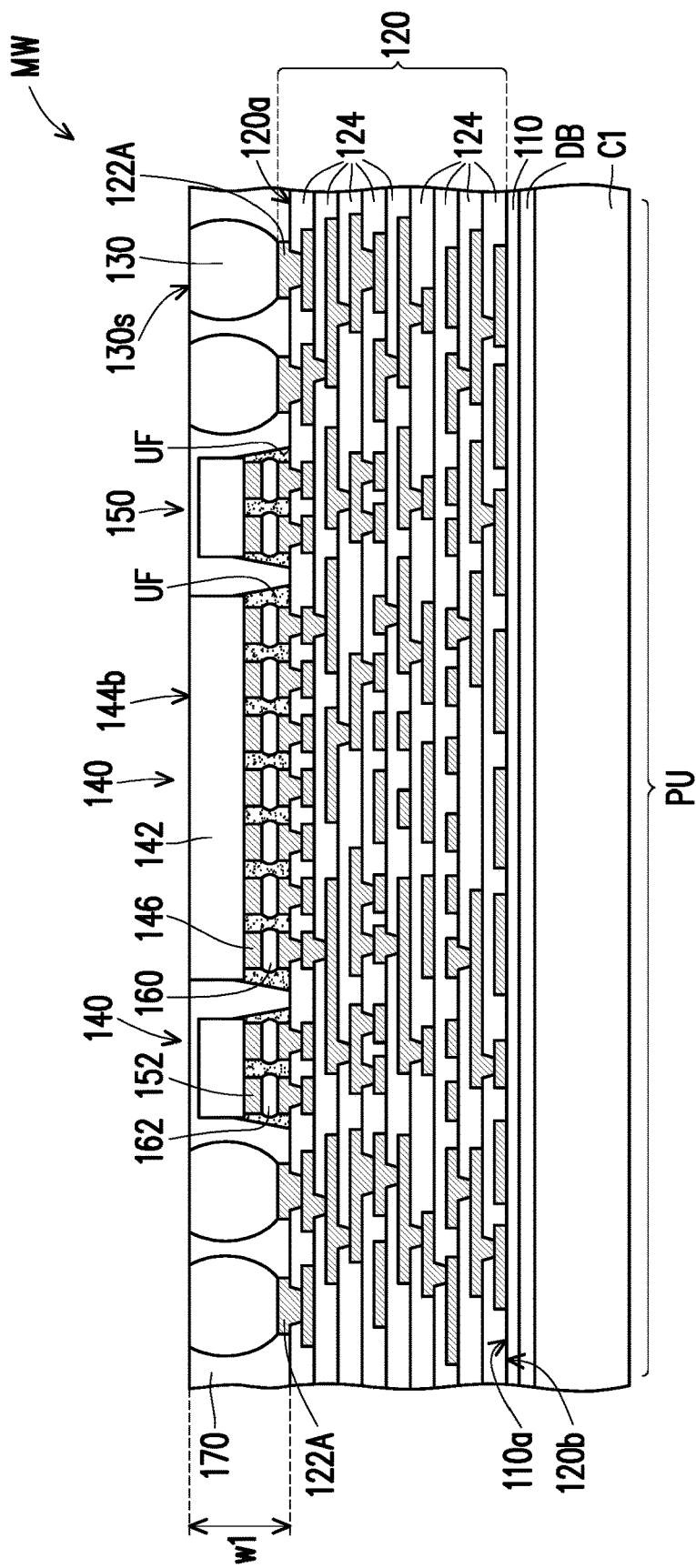

Referring to FIG. 1C, after the semiconductor die 140 and the passive devices 150 are mounted on the redistribution structure 120, an underfill UF is provided to fill the gap between the redistribution structure 120 and the semiconductor die 140 as well as the gap between the redistribution structure 120 and the passive devices 150. In some embodiments, as shown in FIG. 1C, the conductive connectors 146, the solder regions 160, the conductive connectors 152, the solder regions 162 and a portion of the topmost conductive wiring layer 122A are encapsulated by the underfill UF. In other words, the conductive connectors 146, the solder regions 160, the conductive connectors 152, the solder regions 162 and a portion of the topmost conductive wiring layer 122A are being well protected by the underfill UF. In some embodiments, the underfill UF also partially covers sidewalls of the semiconductor die 140 and sidewalls of the passive devices 150. In some embodiments, the material of the underfill UF includes molding compound, epoxy, molding underfill (MUF), a resin, or the like. Owing to the underfill UF, the bonding strength the redistribution structure 120 and the semiconductor die 140 as well as the bonding strength between the redistribution structure 120 and the passive devices 150 are enhanced, thereby improving the reliability of the subsequently formed semiconductor package 10.

Continued on FIG. 1C, an encapsulant 170 is formed over the carrier C1 and surrounding the semiconductor die 140, the passive devices 150 and the conductive connectors 130. In some embodiments, as shown in FIG. 1C, the encapsulant 170 laterally encapsulates the semiconductor die 140, the passive devices 150 and the conductive connectors 130. In other words, the encapsulant 170 at least covers and wraps around the sidewalls of the semiconductor die 140, the passive devices 150 and the conductive connectors 130. Further, as shown in FIG. 1C, the encapsulant 170 is formed to fill the gap between the semiconductor die 140 and the passive devices 150, the gap between the passive devices 150 and the conductive connectors 130, and the gap between the conductive connectors 130. In some embodiments, the encapsulant 170 may be referred to as "gap-fill material". In some embodiments, the thickness w1 of the encapsulant 170 ranges from about 80 to about 500 μtn.

In some embodiments, the encapsulant 170 is formed by forming an encapsulating material (not shown) over the carrier C1 fully covering the semiconductor die 140, the passive devices 150 and the conductive connectors 130, and then performing a planarization process on the encapsulating material to expose the rear surface 144b (illustrated as the top surface in FIG. 1C) of the semiconductor die 140 and the surfaces 130s (illustrated as the top surfaces in FIG. 1C) of the conductive connectors 130. In some embodiments, the encapsulating material of the encapsulant 170 includes a molding compound, a molding underfill, a resin (such as epoxy resin, phenolic resin), or the like. In some alternative embodiments, the encapsulating material of the encapsulant 170 include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulating material of the encapsulant 170 may further include filler particles (e.g., silica, clay or the like). In some embodiments, the encapsulating material of the encapsulant 170 is formed through an over-molding process. For example, the over-molding process is a compression molding process. In some alternative embodiments, the encapsulating material of the encapsulant 170 is formed through a film deposition process. For example, the film deposition process includes CVD, HDPCVD, PECVD), atomic layer deposition (ALD, or combinations thereof. In some embodiments, the planarization process includes a mechanical grinding process, a chemical mechanical polishing (CMP) process, or combinations thereof.

In some embodiments, during the planarization process for forming the encapsulant 170, the conductive connectors 130 are partially removed so that the surfaces 130s of the conductive connectors 130 are revealed and levelled with the surface 170s (illustrated as the top surface in FIG. 1C) of the encapsulant 170. In other words, the conductive connectors 130 penetrate through the encapsulant 170 for dual-side connection. In addition, in some embodiments, the passive devices 150 are coved and well protected by the encapsulant 170. In other words, the passive devices 150 are not revealed. However, the disclosure is not limited thereto. In some alternative embodiments, the passive devices 150 may be revealed.

In some embodiments, through the formation of the encapsulant 170, the semiconductor die 140, the passive devices 150 and the conductive connectors 130 are all molded into a molded structure MW (similar to a reconstructed wafer structure). In some embodiments, as mentioned above, the molded structure MW includes multiple packaging units PU. In other words, the exemplary processes may be performed at a reconstructed wafer level, so that the multiple units PU are processed in the form of a reconstructed wafer. As mentioned above, the bonding strength between the semiconductor die 140 and the redistribution structure 120 bonded with each other through bump joints is strong enough to facilitate releasing the stress resulted from CTE mismatch between the carrier C1 and the dielectric layer 110 as well as the dielectric layers 124 of the redistribution structure 120, therefore even the redistribution structure 120 formed to have 5 to 10 redistribution layers 122 over the carrier C1 is warped to cause a height variation (difference) across the surface 120a of the redistribution structure 120 before the underfill UF and the encapsulant 170 are formed, the warpage can be reduced and compensated after the underfill UF and the encapsulant 170 are formed due to CTE mismatch between the dielectric layers 124 of the redistribution structure 120 and the encapsulant 170, the underfill UF along with the semiconductor die 140. That is to say, the warpage degree of the redistribution structure 120 before forming the underfill UF and the encapsulant 170 is greater than the warpage degree of the redistribution structure 120 in the molded structure MW. As such, even the redistribution structure 120 is formed to have 5 to 10 redistribution layers 122, the molded structure MW can be a warpage-free structure or a slightly-warped structure where the height variation (difference) can be negligible. That is to say, the surface 170s of the encapsulant 170, the surfaces 130s of the conductive connectors 130 and the rear surface 144b of the semiconductor die 140 can have a high degree of planarity. In certain embodiments, compared with the warpage degree of the redistribution structure 120 before forming the underfill UF and the encapsulant 170, the height variation (difference) across the surface of the molded structure MW is reduced by about 300 μm to about 500 μm.

Figure 1D:
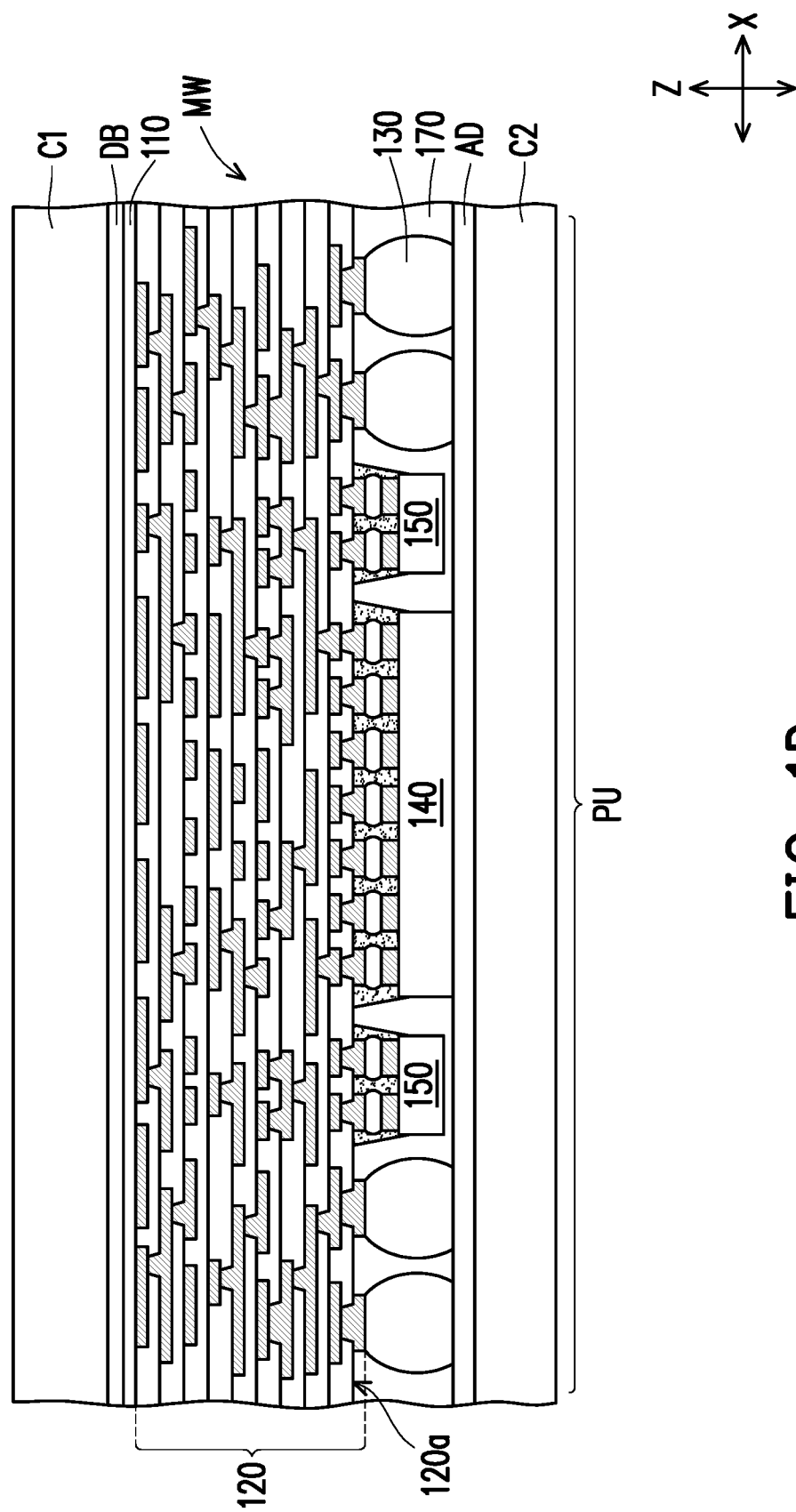

Referring to FIG. 1D, after forming the molded structure MW, the structure shown in FIG. 1C is flipped (i.e., turned upside down) and placed on a carrier C2 for further processing. In some embodiments, as shown in FIG. 1D, the encapsulant 170, the conductive connectors 130 and the semiconductor die 140 are boned to the carrier C2 through an adhesive layer AD. In some embodiments, the adhesive layer AD includes a die attach film (DAF). However, the disclosure is not limited thereto. In some alternative embodiments, other materials may be adapted as the adhesive layer AD as long as the said materials are able to strengthen the adhesion between the carrier C2 and the encapsulant 170, the conductive connectors 130 along with the semiconductor die 140. In certain embodiments, the carrier C2 is a glass carrier, a metal plate, a plastic supporting board or the like, but other suitable substrate materials may be used as long as the materials are able to withstand the subsequent steps of the process.

Figure 1E:
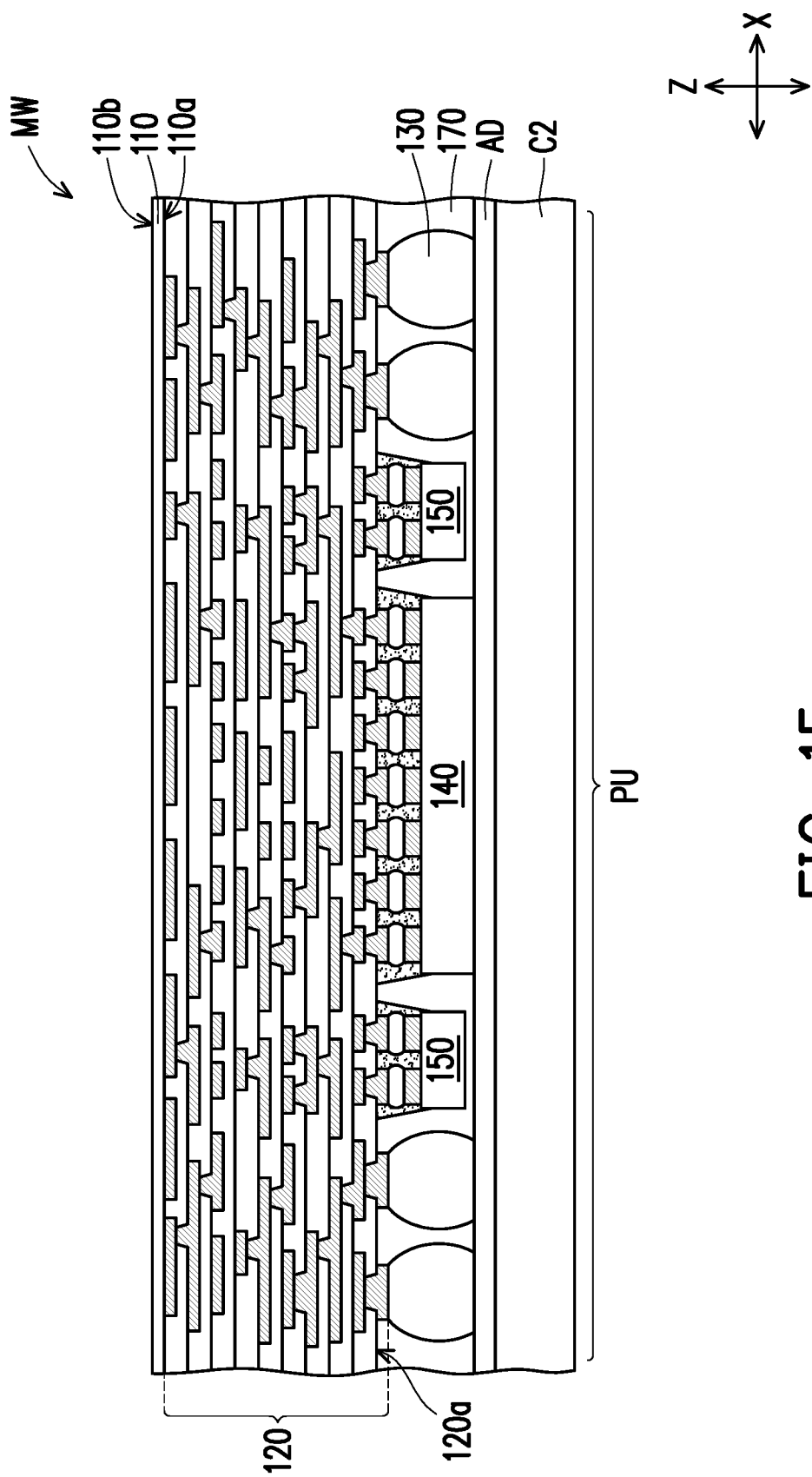

Referring to FIG. 1E, after the molded structure MW is bonded to the carrier C2, the carrier C1 is de-bonded and is separated from the dielectric layer 110 of the molded structure MW. In some embodiments, the de-bonding process includes projecting a light such as a laser light or an UV light on the de-bonding layer DB (e.g., the LTHC release layer) so that the carrier C1 can be easily removed along with the de-bonding layer DB. After the de-bonding process, a surface 110b (i.e., the illustrated top surface in FIG. 1E) opposite to the surface 110a of the dielectric layer 110 is revealed or exposed.

Figure 1F:
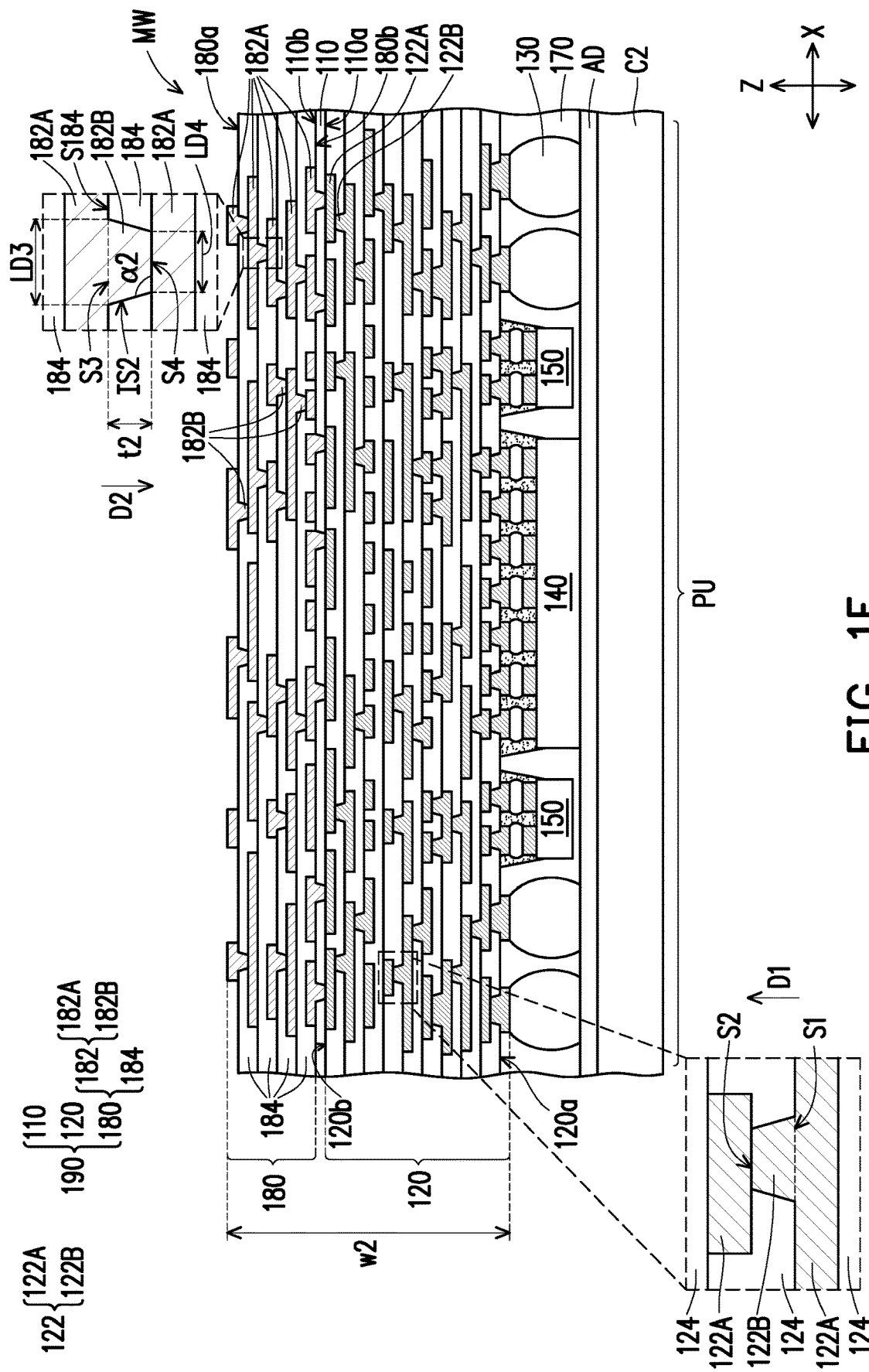

Referring to FIG. 1F, a redistribution structure 180 is formed over the surface 120b (illustrated as the top surface in FIG. 1F) of the redistribution structure 120. In some embodiments, as shown in FIG. 1F, the redistribution structure 180 is in physical and direct contact with the surface 120b of the redistribution structure 120. That is to say, in the molded structure MW, the redistribution structure 120 is located between the redistribution structure 180 and the semiconductor die 140, and between the redistribution structure 180 and the conductive connectors 130. In other words, in the molded structure MW, the redistribution structure 180 and the semiconductor die 140 are located at the opposite sides of the redistribution structure 120, and the redistribution structure 180 and the conductive connectors 130 are located at the opposite sides of the redistribution structure 120.

In some embodiments, the formation of the redistribution structure 180 includes sequentially forming multiple redistribution layers 182 and multiple dielectric layers 184 in alternation. That is to say, the redistribution structure 180 includes multiple redistribution layers 182 and multiple dielectric layers 184 stacked alternately along the direction Z. In certain embodiments, as shown in FIG. 1F, the redistribution layers 182 are sandwiched between the dielectric layers 124, where portions of the topmost layer of the redistribution layers 182 are located on the topmost layer of the dielectric layers 184 for being connected with one or more overlying connectors (e.g., later-formed conductive connector(s) or semiconductor device(s) such as active device(s) or passive device(s)), and the bottommost layer of the redistribution layers 182 is exposed by the dielectric layer 110 for being connected with the underlying conductive wiring layer 122A of the redistribution structure 120. Moreover, as shown in FIG. 1F, the topmost layer of the redistribution layers 182 protrudes from the illustrated top surface of the topmost layer of the dielectric layers 184, that is, the illustrated top surface of the topmost layer of the redistribution layers 182 is higher than the illustrated top surface of the topmost layer of the dielectric layers 184. However, the disclosure is not limited thereto. In some alternative embodiments, the illustrated top surface of the topmost layer of the redistribution layers 182 may be substantially level with the illustrated top surface of the topmost layer of the dielectric layers 184. Further, as shown in FIG. 1F, the illustrated bottom surface of the bottommost layer of the redistribution layers 182 and the surface 110*a* (illustrated as the bottom surface in FIG. 1F) of the dielectric layer 110 are substantially level with each other, and are in contact with the redistribution structure 120. It is noted that although five redistribution layers 182 and four dielectric layers 184 are illustrated herein, the scope of the disclosure is not limited by the embodiments of the disclosure. In some embodiments, the number of the redistribution layers 182 ranges from 4 to 10. That is to say, during the formation of the redistribution structure 180, 4 to 10 redistribution layers 182 may be formed over the redistribution structure 120. In some embodiments, for the redistribution structure 180, the dielectric layer 110 is an additional dielectric layer. However, the disclosure is not limited thereto. In some alternative embodiments, the dielectric layer 110 may be a part of the redistribution structure 180.

In some embodiments, the dielectric layer 184 is formed in a manner similar to the dielectric layer 124, and is formed of a material similar to the material of the dielectric layer 124. Therefore, the detailed descriptions of the dielectric layer 184 will be omitted herein. Further, in some embodiments, the redistribution layer 182 is formed in a manner similar to the redistribution layer 122, and is formed of a material similar to the material of the redistribution layer 122. Therefore, the detailed descriptions of the redistribution layer 182 will be omitted herein.

In some embodiments, each of the redistribution layers 182 includes a conductive wiring layer 182A and one or more conductive vias 182B. In some embodiments, in the redistribution structure 180, the dielectric layers 184 and the conductive wiring layers 182A are stacked alternately along the direction Z. In some embodiments, in the redistribution structure 180, the conductive wiring layer 182A of the bottommost redistribution layer 182 extends horizontally on the surface 110*b* (illustrated as the top surface in FIG. 1F) of the dielectric layer 110 along the direction X, and each of the rest conductive wiring layers 182A extends horizontally on the surface S184 (illustrated as the top surface in FIG. 1F) of the corresponding dielectric layer 184 along the direction X. In some embodiments, the conductive vias 182B of the bottommost redistribution layer 182 are embedded in the dielectric layer 110, and each conductive via 182B of the bottommost redistribution layer 182 extends vertically through the dielectric layer 110 along the direction Z to establish electrical connection between the redistribution structure 180 and the redistribution structure 120. In detail, as shown in FIG. 1F, the conductive vias 182B of the bottommost redistribution layer 182 are in physical and direct contact with the conductive wiring layer 122A at the surface 120*b* of the redistribution structure 120. That is to say, among the redistribution layers 182 of the redistribution structure 180, the bottommost redistribution layer 182 is closest to the redistribution structure 120. In some embodiments, the conductive vias 182B of the rest redistribution layers 182 are embedded in the dielectric layers 184, and each of the said conductive vias 182B extends vertically through the corresponding dielectric layer 184 along the direction Z to establish electrical connection between two conductive wiring layers 182A. That is to say, two conductive wiring layers 182A are electrically connected with each other through the conductive vias 182B sandwiched therebetween. In other words, the conductive wiring layers 182A in the redistribution structure 180 are interconnected with one another through the conductive vias 182B. In some embodiments, each of the conductive wiring layers 182A may include conductive traces (conductive lines), conductive pads or a combination thereof. In certain embodiments, the topmost conductive wiring layer 182A includes multiple conductive pads.

In some embodiments, as shown in FIG. 1F, the cross-sectional shape of the conductive via 182B is inverted trapezoid. That is to say, in the cross-sectional view shown from FIG. 1F, along the direction X, the lateral dimension LD3 of the surface S3 (illustrated as the top surface in FIG. 1F) of the conductive via 182B is larger than the lateral dimension LD4 of the surface S4 (illustrated as the bottom surface in FIG. 1F) of the conductive via 182B. In other words, the lateral dimension of the conductive via 182B decreases from the top of the conductive via 182B to the bottom of the conductive via 182B along the direction Z. In some embodiments, from a top view, the surface S3 and the surface S4 of the conductive via 182B each have a circular shape. In other words, a cross-section of the conductive via 182B parallel to the surface S3 or the surface S4 is a circle. However, the disclosure is not limited thereto. In some alternative embodiments, from a top view, the surface S3 and the surface S4 of the conductive via 182B each may have an elliptical shape, a polygonal shape or other suitable shapes. In the case that the surface S3 and the surface S4 of the conductive via 182B each have a circular top-view shape, then the lateral dimension LD3 and the lateral dimension LD4 each may be the diameter. In the case that the surface S3 and the surface S4 of the conductive via 182B each have a polygonal top-view shape, then the lateral dimension LD3 and the lateral dimension LD4 each may be the maximum dimension. From another point of view, in some embodiments, the conductive via 182B has a shape of an inverted frustum (i.e., an inverted cone or pyramid with the tip truncated). That is to say, the area of the surface S3 of the conductive via 182B is greater than the area of the surface S4 of the conductive via 182B. In other words, as shown in FIG. 1F, the conductive via 182B is tapered toward the dielectric layer 110, the redistribution structure 120 and the semiconductor die 140 along the direction Z. For example, the conductive via 182B may have a shape of an inverted frustum of a cone, an elliptic cone, or a pyramid.

At the stage illustrated in FIG. 1F, the cross-sectional shape of the conductive via 182B is inverted trapezoid, and the cross-sectional shape of the conductive via 122B is trapezoid. That is to say, the surface S2 of the conductive via 122B, which has the area smaller that the area of the surface S1 of the conductive via 122B, faces the surface S4 of the conductive via 182B, which has the area smaller that the area of the surface S3 of the conductive via 182B, and the surface S2 of the conductive via 122B as well as the surface S4 of the conductive via 182B are located between the surface S1 of the conductive via 122B and the surface S3 of the conductive via 182B. In other words, the decreasing direction of the lateral dimension of the conductive via 122B is opposite to the decreasing direction of the lateral dimension of the conductive via 182B. In detail, as shown in FIG. 1F, the lateral dimension of the conductive via 122B decreases gradually along a first direction D1 extending from the surface S1 to the surface S2, the lateral dimension of the conductive via 182B decreases gradually along a second direction D2 extending from the surface S3 to the surface S4, the first direction D1 is opposite to the second direction D2, and the first direction D1 as well as the second direction D2 are parallel to the direction Z. Furthermore, as shown in FIG. 1F, the first direction D1 extends from the semiconductor die 140 to the redistribution structure 120, and the second direction D2 extends from the redistribution structure 120 to the semiconductor die 140. From another point of view, at the stage illustrated in FIG. 1F, the conductive via 122B is tapered along the first direction D1, and the conductive via 182B is tapered along the second direction D2. That is to say, the conductive via 122B is tapered away from the semiconductor die 140, and the conductive via 182B is tapered toward the semiconductor die 140.

In some embodiments, as shown in FIG. 1F, the redistribution structure 180, the dielectric layer 110 and the redistribution structure 120 are collectively referred to as a redistribution structure 190. That is to say, after the redistribution structure 180 is formed over the redistribution structure 120, the redistribution structure 190 is rendered on the semiconductor die 140. As mentioned above, the conductive via 182B in the redistribution structure 180 and the conductive via 122B in the redistribution structure 120 have different taper directions (e.g., the cross-sectional shape of the conductive via 182B in the redistribution structure 180 and the cross-sectional shape of the conductive via 122B in the redistribution structure 120 are inverted with respect to each other), and thus the redistribution structure 190 is rendered to have two different portions stacked along the direction Z. Further, as shown in FIG. 1F, the first direction D1 extends from the semiconductor die 140 to the redistribution structure 190, and the second direction D2 extends from the redistribution structure 190 to the semiconductor die 140. In some embodiments, the thickness w2 of the redistribution structure 190 ranges from about 30 to about 100 μm.

As mentioned above, the conductive via 182B may function as a connector between the overlying conductive wiring layer 182A and the underlying conductive wiring layer 182A along the direction Z, or between the overlying conductive wiring layer 182A and the underlying conductive wiring layer 122A along the direction Z, thereby the surface S3 and the surface S4 of the conductive via 182B are in contact with the corresponding conductive wiring layers in the redistribution structure 190. In detail, in the redistribution structure 190, the surface S3 and the surface S4 of the conductive via 182B of the bottommost redistribution layer 182 are respectively in physical and direct contact with the corresponding conductive wiring layer 182A and the corresponding conductive wiring layer 122A at the surface 120b of the redistribution structure 120, and the surface S3 and the surface S4 of the conductive via 182B of the rest redistribution layers 182 are in physical and direct contact with the corresponding conductive wiring layers 182A. That is to say, the area of the surface S3 and the area of the surface S4 are referred to as contact areas between the two conductive wiring layers in the redistribution structure 190 and the conductive via 182B sandwiched therebetween. In some embodiments, as shown in FIG. 1F, the contact area (i.e., the area of the surface S3) between the conductive via 182B and the overlying conductive wiring layer 182A is greater than the contact area (i.e., the area of the surface S4) between the conductive via 122B and the underlying conductive wiring layer 182A or 122A. In some embodiments, as shown in FIG. 1F, the surface S3 of the conductive via 182B is in contact with the conductive wiring layer 182A which is in the same redistribution layer 182 as the said conductive via 182B, and the surface S4 of the conductive via 182B is in contact with the underlying conductive wiring layer 182A which is in the different redistribution layer 182 from the said conductive via 182B. In some embodiments, as shown in FIG. 1F, the surface S3 of the conductive via 182B is substantially coplanar with and flush with the surface S184 of the corresponding dielectric layer 184 or the surface 110b of the dielectric layer 110. In some embodiments, the ratio of the surface S3 to the surface S4 ranges from about 1.2 to about 1.8. With such configuration, the manufacturing process of the semiconductor package 10 can be compatible with the currently-adopted manufacturing process, thereby improving the production yield of the semiconductor package 10. Further, as mentioned above, each conductive via 122B of the redistribution structure 120 is in physical and direct contact with the corresponding conductive wiring layers 122A for rendering electrical connection, and thus the conductive via 182B and the conductive via 122B in physical and direct contact with the same conductive wiring layer 122A at the surface 120b of the redistribution structure 120 have different taper directions.

In some embodiments, the conductive via 182B is formed with an inclined sidewall IS2 connecting with the surface S3 and the surface S4. In some embodiments, an angle α2 between the inclined sidewall IS2 and the surface S4 is an obtuse angle. In some embodiments, the angle α2 is in the range from about 95 degrees to about 110 degrees. With such configuration, the manufacturing process of the semiconductor package 10 can be compatible with the currently-adopted manufacturing process, thereby improving the production yield of the semiconductor package 10. In some embodiments, the thickness t2 of the conductive via 182B is in the range from about 5 μm to about 8 μm. With such configuration, the manufacturing process of the semiconductor package 10 can be compatible with the currently-adopted manufacturing process, thereby improving the production yield of the semiconductor package 10.

In some embodiments, the redistribution structure 180 has a surface 180a and a surface 180b opposite to the surface 180a. As shown in FIG. 1F, the surface 180a of the redistribution structure 180 is illustrated as the top surface, and the surface 180b of the redistribution structure 180 is illustrated as the bottom surface. In some embodiments, the surface 180b faces the redistribution structure 120. In some embodiments, the surface 180b is attached to the surface 110b of the dielectric layer 110 and the surface 120a of the redistribution structure 120. In some embodiments, the surface 180a is constituted by the topmost dielectric layer 184 and the topmost conductive wiring layer 182A, and the surface 180b is constituted by the bottommost dielectric layer 184 and the bottommost conductive wiring layer 182A.

In some embodiments, the redistribution structure 180 is formed to include only one portion 180A. In certain embodiments, the portion 180A is a fine-featured portion. In such embodiments, the pitches of the redistribution layers 182 in the portion 180A are smaller than the pitches of the redistribution layers 122 in the coarse-featured portion 120A, and the pitches of the redistribution layers 182 in the portion 180A may be the same as or different from the pitches of the redistribution layers 122 in the fine-featured portion 120B. However, the disclosure is not limited thereto. In alternative embodiments, the portion 180A is a coarse-featured portion. In such embodiments, the pitches of the redistribution layers 182 in the portion 180A are greater than the pitches of the redistribution layers 122 in the fine-featured portion 120B, and the pitches of the redistribution layers 182 in the portion 180A may be the same as or different from the pitches of the redistribution layers 122 in the coarse-featured portion 120A. In yet alternative embodiments, the redistribution structure 180 is formed to include a coarse-featured portion and a fine-featured portion, i.e., two different portions. In such embodiments, the coarse-featured portion and the fine-featured portion of the redistribution structure 180 may be similar to the coarse-featured portion 120A and the fine-featured portion 120B of the redistribution structure 120, hence its detailed descriptions may be referred thereto.

As mentioned above, the warpage of the redistribution structure 120 having 5 to 10 redistribution layers 122 over the carrier C1 can be reduced and compensated after the encapsulant 170 is formed due to CTE mismatch between the dielectric layers 124 of the redistribution structure 120 and the encapsulant 170, the underfill UF (if present) along with the semiconductor die 140, thereby the redistribution structure 190 rendered by forming the redistribution structure 180 over the redistribution structure 120 and opposite to the semiconductor die 140 can be formed without confronting high warpage issue. That is to say, by performing twice redistribution structure processes (i.e., one process for the redistribution structure 120 over the carrier C1, another process for the redistribution structure 180 over the carrier C2) to form the redistribution structure 190 capable of having equal to or greater than 10 redistribution layers (e.g., redistribution layers 122 and redistribution layers 182), the risk of high warpage with which forming a redistribution structure having equal to or greater than 10 redistribution layers through one redistribution structure process over one carrier is confronted can be prevented. In other words, even the redistribution structure 190 having equal to or greater than 10 redistribution layers (e.g., redistribution layers 122 and redistribution layers 182) is formed over the carrier C2, the molded structure MW can be prevented from confronting high warpage issue. As such, the production yield of the subsequently formed semiconductor package 10 even with the redistribution structure 190 having equal to or greater than 10 redistribution layers (e.g., redistribution layers 122 and redistribution layers 182) can be improved. In some embodiments, after redistribution structure 190 is formed, the molded structure MW can be a warpage-free structure or a slightly-warped structure where the height variation (difference) can be negligible.

Moreover, although FIG. 1F illustrates that all the redistribution layers 122 and all the redistribution layers 182 in the redistribution structure 190 are electrically connected with each other for signal transmission, the scope of the disclosure is not limited by the embodiments of the disclosure. In some alternative embodiments, 50% to 70% of the redistribution layers in the redistribution structure 190 may receive a reference voltage (e.g., a ground voltage), so as to be functioned as electromagnetic shielding structures for blocking electromagnetic interference. In such embodiments, the redistribution layer functioned as the electromagnetic shielding structure may be a blanket conductive layer with at least one opening allowing at least one conductive via penetrating through it for signal transmission.

Figure 1G:
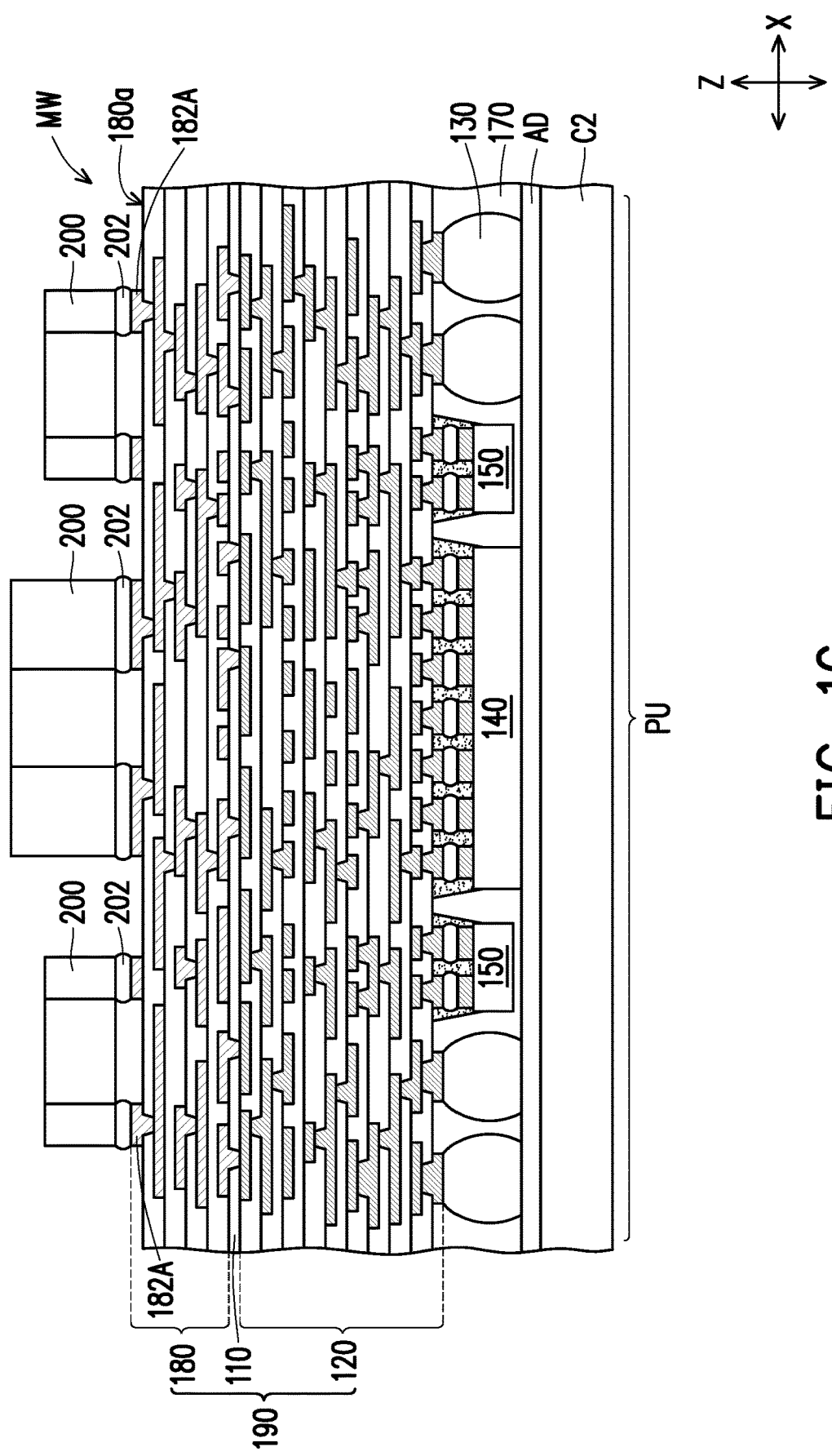

Referring to FIG. 1G, after the redistribution structure 190 is formed, a plurality of semiconductor devices 200 may be optionally provided over the surface 180a of the redistribution structure 180. In some embodiments, the semiconductor devices 200 are mounted on the redistribution structure 190 opposite to the semiconductor die 140. In some embodiments, as shown in FIG. 1G, the semiconductor devices 200 are mounted on the redistribution structure 190 through a chip-to-wafer bonding process such that the semiconductor devices 200 are electrically connected with the topmost redistribution layer 182 of the redistribution structure 180. In some embodiments, through the redistribution structure 190, the semiconductor devices 200 are electrically connected with the semiconductor die 140, the passive devices 150 as well as the conductive connectors 130. Although FIG. 1G illustrates that three semiconductor devices 200 are placed on the topmost conductive wiring layer 182A in one packaging unit PU, it should be noted that the number of the semiconductor devices 200 placed on the topmost conductive wiring layer 182A in one packaging unit PU is not limited thereto, and can be adjusted based on demand and/or design layout.

In some embodiments, the semiconductor device 200 may be an active device or a passive device. In some embodiments, the active device may be a memory device (such as a dynamic random access memory (DRAM), IPD, or SoC) or the like. In some embodiments, the passive device may be a surface mount device (SMD), a capacitor (such as multilayer ceramic capacitor (MLCC), or IPD), a resistor, an inductor, a fuse or the like. It is noted that although the semiconductor devices 200 having different sizes are illustrated herein, the scope of the disclosure is not limited by the embodiments of the disclosure. In some alternative embodiments, the semiconductor devices 200 provided on the redistribution structure 190 may have the same size. In some embodiments, the semiconductor devices 200 provided on the redistribution structure 190 have the same function and property. In some alternative embodiments, the semiconductor devices 200 provided on the redistribution structure 190 have different functions and properties.

In some embodiments, the semiconductor device 200 includes conductive terminals 202, and the semiconductor device 200 is mounted on the conductive pads included in the topmost conductive wiring layer 182A through the conductive terminals 202. Hence, the conductive terminals 202 may serve as the connectors for connecting the semiconductor device 200 with the redistribution structure 190, and the conductive pads included in the topmost conductive wiring layer 182A may serve as the connection pads for connecting to the semiconductor device 200. In some embodiments, the semiconductor device 200 is electrically connected with the semiconductor die 140, the conductive connectors 130 and the passive devices 150 through the redistribution structure 190. In some embodiments, the conductive terminals 202 are micro-bumps, or controlled collapse chip connection (C4) bumps. In some embodiments, the conductive terminals 202 are solder bumps. In some embodiments, the said conductive pads in the topmost conductive wiring layer 182A for connecting to the semiconductor device 200 are referred to as under-bump metallurgy patterns for bump bonding. In some embodiments, the conductive terminals 202 are made of a conductive material with low resistivity, such as Sn, Pb, Ag, Cu, Ni, Bi, or an alloy thereof. In some embodiments, a solder flux (not shown) may be applied onto the conductive terminals 202 for better adhesion. In some embodiments, the semiconductor device 200 may be mounted on the redistribution structure 190 through a soldering process, a reflowing process, or other suitable processes. In some embodiments, the conductive terminals 202 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive terminals 202 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The semiconductor device 200 present in FIG. 1G is shown having two conductive terminals 202 bonded to two conductive pads in the topmost conductive wiring layer 182A, but the number of the conductive terminals 202 to be bonded to the conductive pads in the topmost conductive wiring layer 182A is not particularly limited to the embodiments and can be varied based on design requirements.

Figure 1H:
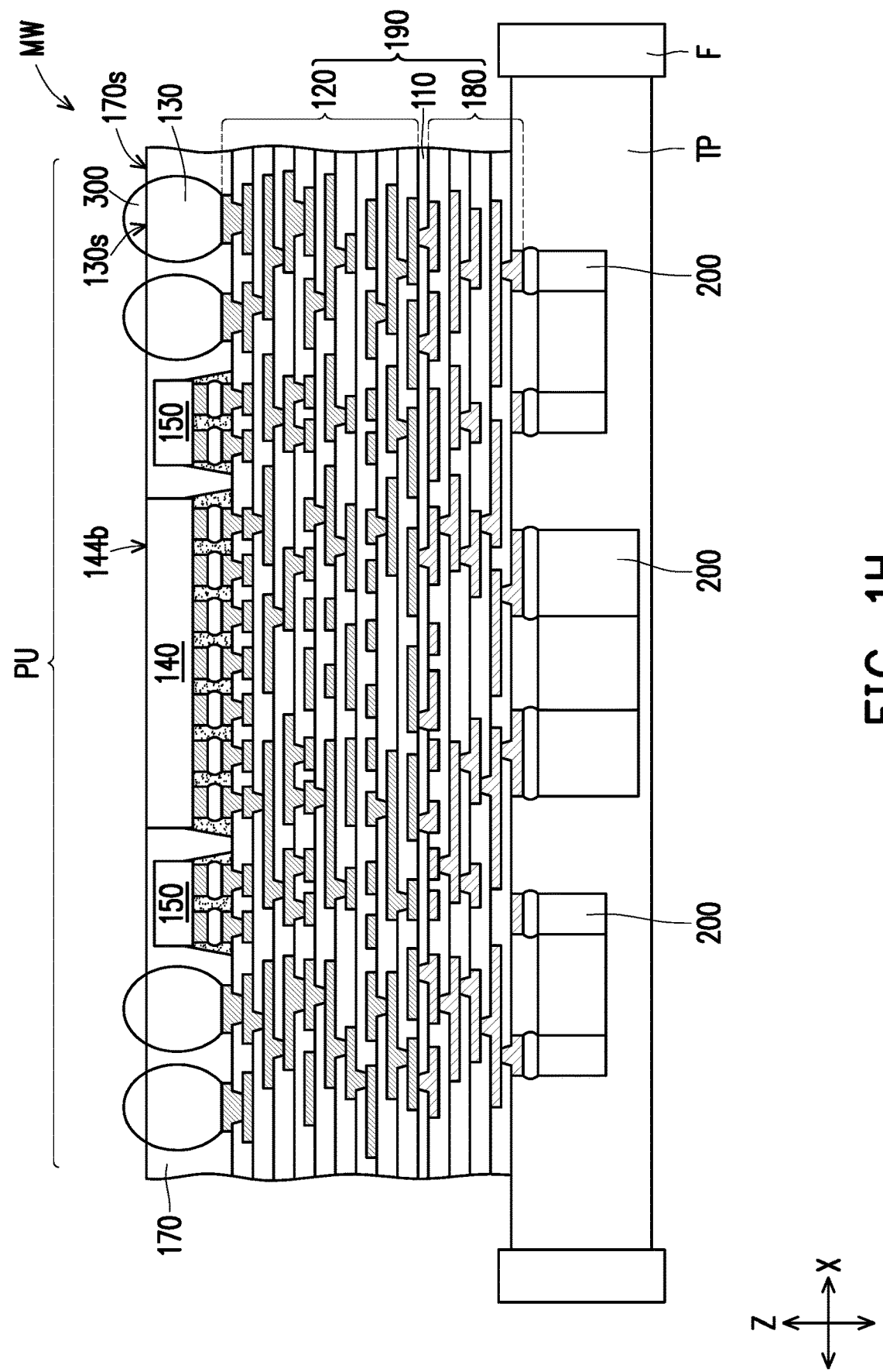

Referring to FIG. 1G and FIG. 1H, the structure illustrated in FIG. 1G is flipped (i.e., turned upside down) and is attached to a tape TP (e.g., a dicing tape) supported by a frame F for further processing. Subsequently, the carrier C2 is de-bonded and is separated from the encapsulant 170, the semiconductor dies 110, and the conductive connectors 130. During the de-bonding process, a portion of the adhesive layer AD may stick on the carrier C2 and may be carried away by the carrier C2. Meanwhile, another portion of the adhesive layer AD remains on the encapsulant 170, the semiconductor dies 110, and the conductive connectors 130. In some embodiments, the remaining portion of the adhesive layer AD is removed by wet etching or laser cleaning. In some embodiments, after removing the carrier C2 and the adhesive layer AD from the encapsulant 170, the semiconductor dies 110, and the conductive connectors 130, the surface 170s (illustrated as the top surface in FIG. 1H) of the encapsulant 170, the rear surface 144b of the semiconductor die 140 and the surfaces 130s (illustrated as the top surface in FIG. 1H) of the conductive connectors 130 are revealed or exposed. In some embodiments, as shown in FIG. 1H, the exposed surface 170s of the encapsulant 170, the exposed rear surface 144b of the semiconductor die 140 and the exposed surfaces 130s of the conductive connectors 130 are substantially coplanar with and levelled with one another.

Continued on FIG. 1H, after removing the carrier C2 and the adhesive layer AD, a plurality of conductive terminals 300 are placed on the respective conductive connectors 130. In some embodiments, the conductive terminals 300 are in physical and direct contact with the respective surfaces 130s of the conductive connectors 130. In some embodiments, the conductive terminals 300 are disposed on the conductive connectors 130 by a ball placement process. In some embodiments, the conductive terminals 300 are reflowed to bond with the surfaces 130s of the conductive connectors 130. In some embodiments, the conductive terminals 300 are reflowed to reshape into the desired bump shapes. In some embodiments, the conductive terminals 300 are solder balls or BGA balls. In certain embodiments, the conductive terminals 300 are available to be mounted onto additional electrical devices (e.g., circuit carrier, system board, mother board, etc.).

Figure 1I:
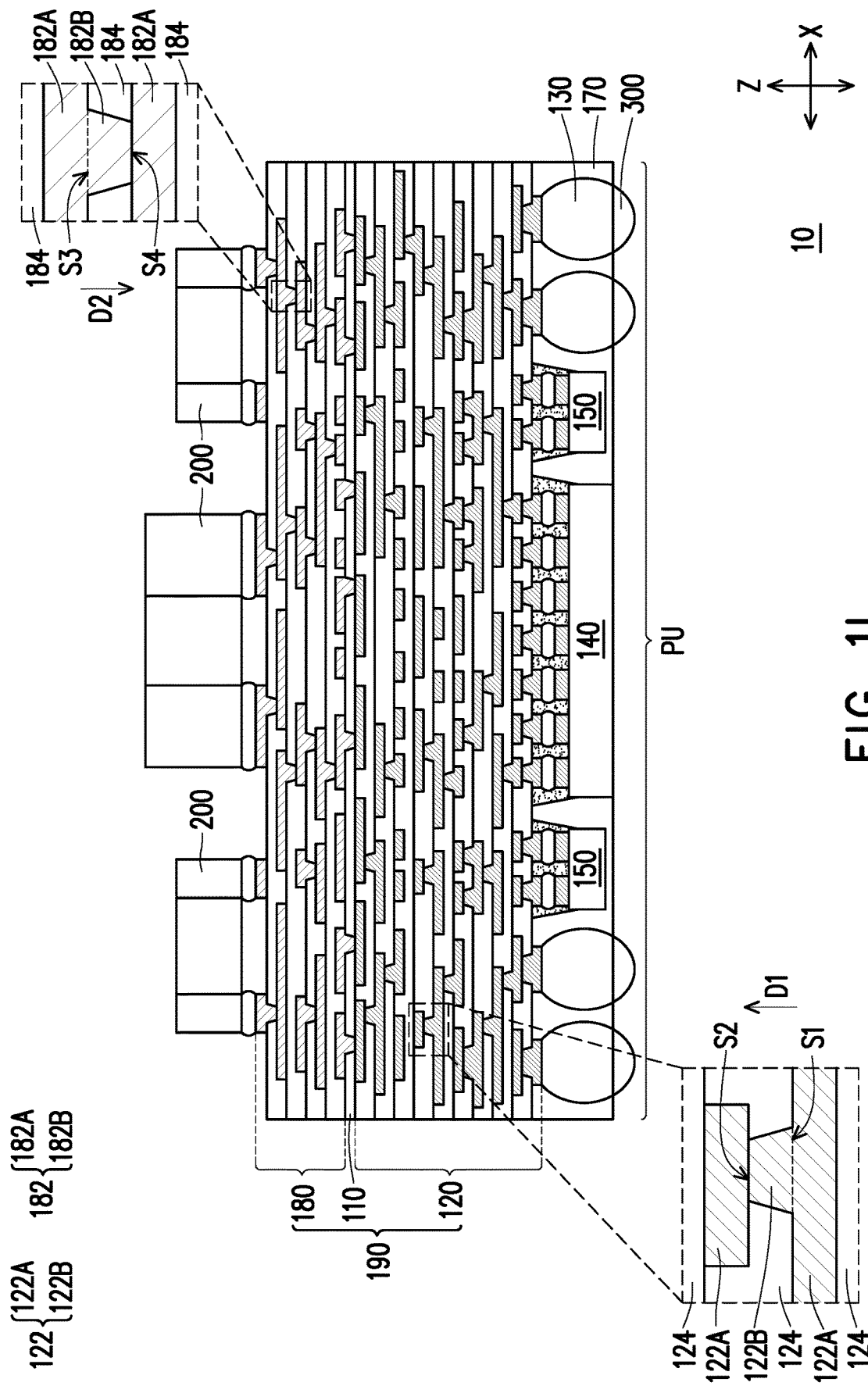

Referring to FIG. 1H and FIG. 1I, after forming the conductive terminals 300, by cutting through the encapsulant 170 and the redistribution layer structure 190, the molded structure MW may be singulated or diced into individual packaging units PU to render a plurality of semiconductor packages 10. In some embodiments, the molded structure MW is cut through a laser cutting process, a mechanical cutting process, or other suitable cutting process. Up to here, the manufacture of the semiconductor package 10 is completed.

As shown in FIG. 1I, the semiconductor package 10 includes the semiconductor die 140 laterally encapsulated by the encapsulant 170, and the redistribution structure 190 disposed on the encapsulant 170 and electrically connected with the semiconductor die 140. In some embodiments, in the semiconductor package 10, the redistribution structure 190 is stacked on the encapsulant 170 along the direction Z. In some embodiments, the redistribution structure 190 of the semiconductor package 10 includes the redistribution structure 120 with 5 to 10 redistribution layers 122 therein and the redistribution structure 180 with 4 to 10 redistribution layers 182 therein. That is to say, through the manufacturing process discussed above in conjunction with FIG. 1A to FIG. 1I, the semiconductor package 10 having equal to or greater than 10 redistribution layers (e.g., redistribution layers 122 and redistribution layers 182) can be realized. As shown in FIG. 1I, in the redistribution structure 190 of the semiconductor package 10, the area of the surface S1 of the conductive via 122B is greater than the area of the surface S2 of the conductive via 122B, the area of the surface S3 of the conductive via 182B is greater than the area of the surface S4 of the conductive via 182B, and the surface S2 and the surface S4 are located between the surface S1 and the surface S3. Further, as shown in FIG. 1I, the surface S2 is located between the surface S1 and the surface S4, and the surface S4 is located between the surface S2 and the surface S2. In addition, as shown in FIG. 1I, the lateral dimension of the conductive via 122B decreases gradually along the first direction D1, the lateral dimension of the conductive via 182B decreases gradually along the second direction D2 opposite to the second direction D1. That is to say, in the semiconductor package 10, the redistribution structure 190 includes two different portions with two different configuration types of the conductive vias. In other words, in the semiconductor package 10, the redistribution structure 190 is formed by two different redistribution structure processes. In some embodiments, the semiconductor package 10 is an integrated fan-out (INFO) package having dual-side terminal design.

In some embodiments, as shown in FIG. 1I, the semiconductor package 10 includes the passive devices 150 between the semiconductor die 140 and the conductive connectors 130. However, the disclosure is not limited thereto. In some alternative embodiments, the semiconductor package 10 may not include passive devices. That is to say, the passive devices 150 are optionally formed in the semiconductor package 10.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the semiconductor package 10 illustrated in FIG. 1I, the conductive connectors 130 may be referred to as conductive balls. However, the disclosure is not limited thereto. In some alternative embodiments, the conductive connectors 130 may be referred to as conductive through vias. Hereinafter, other embodiments will be described with reference to FIG. 2.

Figure 2:
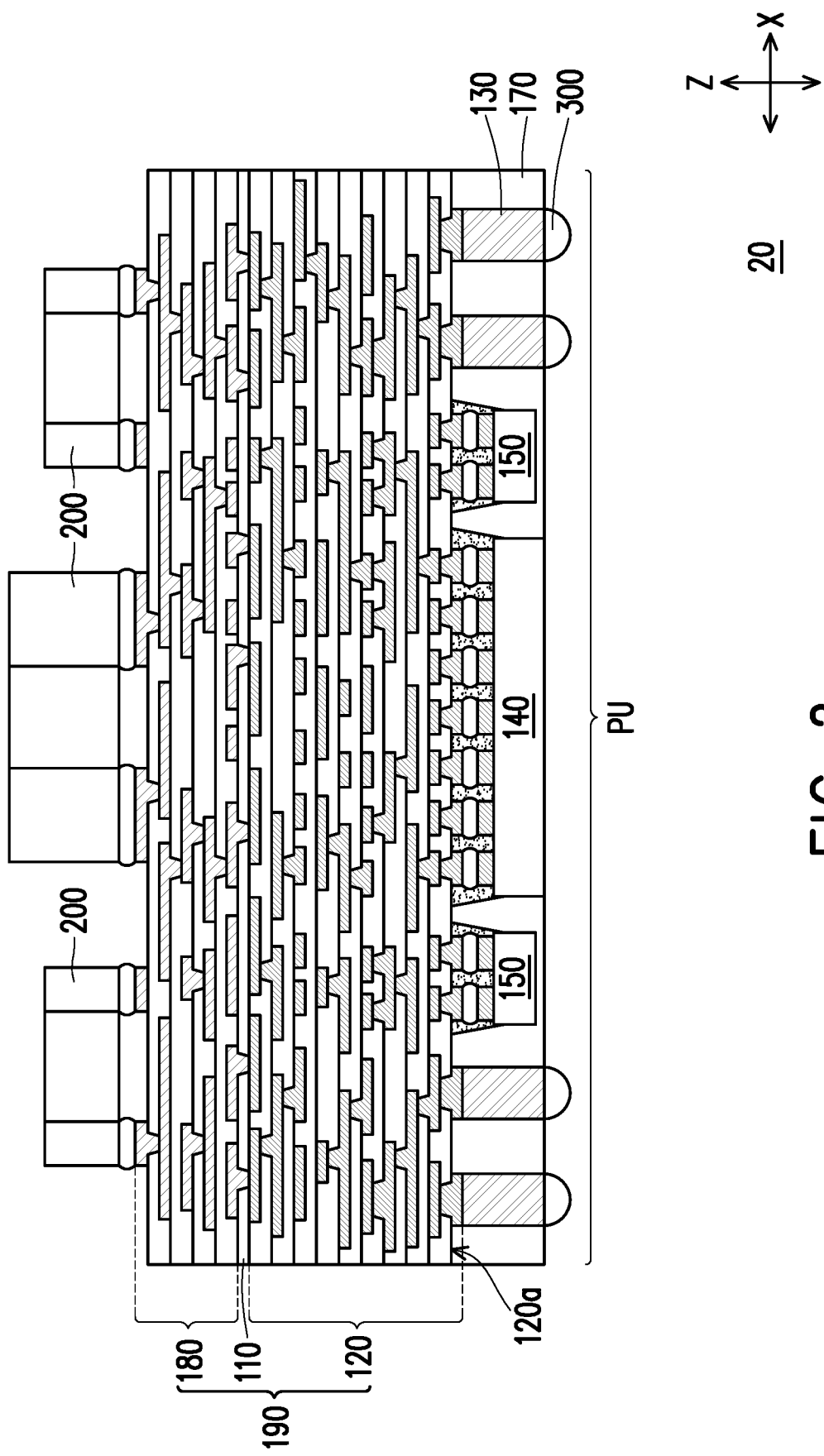
FIG. 2 is a schematic cross-sectional view of a semiconductor package in accordance with some alternative embodiments of the disclosure.

FIG. 2 is a schematic cross-sectional view of a semiconductor package in accordance with some alternative embodiments of the disclosure. The semiconductor package 20 illustrated in FIG. 2 is similar to the semiconductor package 10 illustrated in FIG. 1I, hence the same reference numerals are used to refer to the same or liked parts, and its detailed description will be omitted herein. Referring to FIG. 2 and FIG. 1I, the differences between the package structure 20 illustrated in FIG. 2 and the package structure 10 illustrated in FIG. 1I lies in the type of the conductive connectors 130. In some embodiments, in the semiconductor package 20, the conductive connectors 130 are formed by photoresist coating, photolithography, plating, and photoresist stripping process. In some embodiments, the formation of the conductive connectors 130 includes forming a mask pattern (not shown) with openings exposing the conductive pads included in the topmost conductive wiring layer 122A of the redistribution structure 120, then forming a metallic material (not shown) filling up the openings by electroplating or deposition, and removing the mask pattern to form the conductive connectors 130 on the redistribution structure 120. In some embodiments, the material of the mask pattern may include a positive photo-resist or a negative photo-resist. In some embodiments, the material of the conductive connectors 130 may include a metal material such as copper or copper alloys. The disclosure is not limited thereto.

In some alternative embodiments, the conductive connectors 130 may be formed by forming a seed layer (not shown) on the surface 120a of the redistribution structure 120; forming the mask pattern (not shown) with openings exposing portions of the seed layer which correspond to the conductive pads included in the topmost conductive wiring layer 122A of the redistribution structure 120; forming the metallic material (not shown) on the exposed portions of the seed layer to form the conductive connectors 130 by plating; removing the mask pattern; and then removing portions of the seed layer exposed by the conductive connectors 130. For example, the seed layer may be a titanium/copper composited layer.

In some embodiments, in the semiconductor package 20, the conductive connectors 130 are conductive pillars or conductive posts. In some embodiments, as shown in FIG. 2, the conductive connectors 130 penetrate through the encapsulant 170 to render electrical connection between the topmost conductive wiring layer 122A of the redistribution structure 120 and the conductive terminals 300. As such, in the semiconductor package 20, the conductive connectors 130 are conductive through vias. Also, the conductive connectors 130 are referred to as through insulating vias (TIV) or through integrated fan-out (InFO) vias.

In the semiconductor package 10 illustrated in FIG. 1I, the conductive terminals 300 are in physical and direct contact with the respective surfaces 130s of the conductive connectors 130. However, the disclosure is not limited thereto. In some alternative embodiments, the conductive terminals 300 may be electrically connected with the conductive connectors 130 through a redistribution structure. Hereinafter, other embodiments will be described with reference to FIG. 3.

Figure 3:
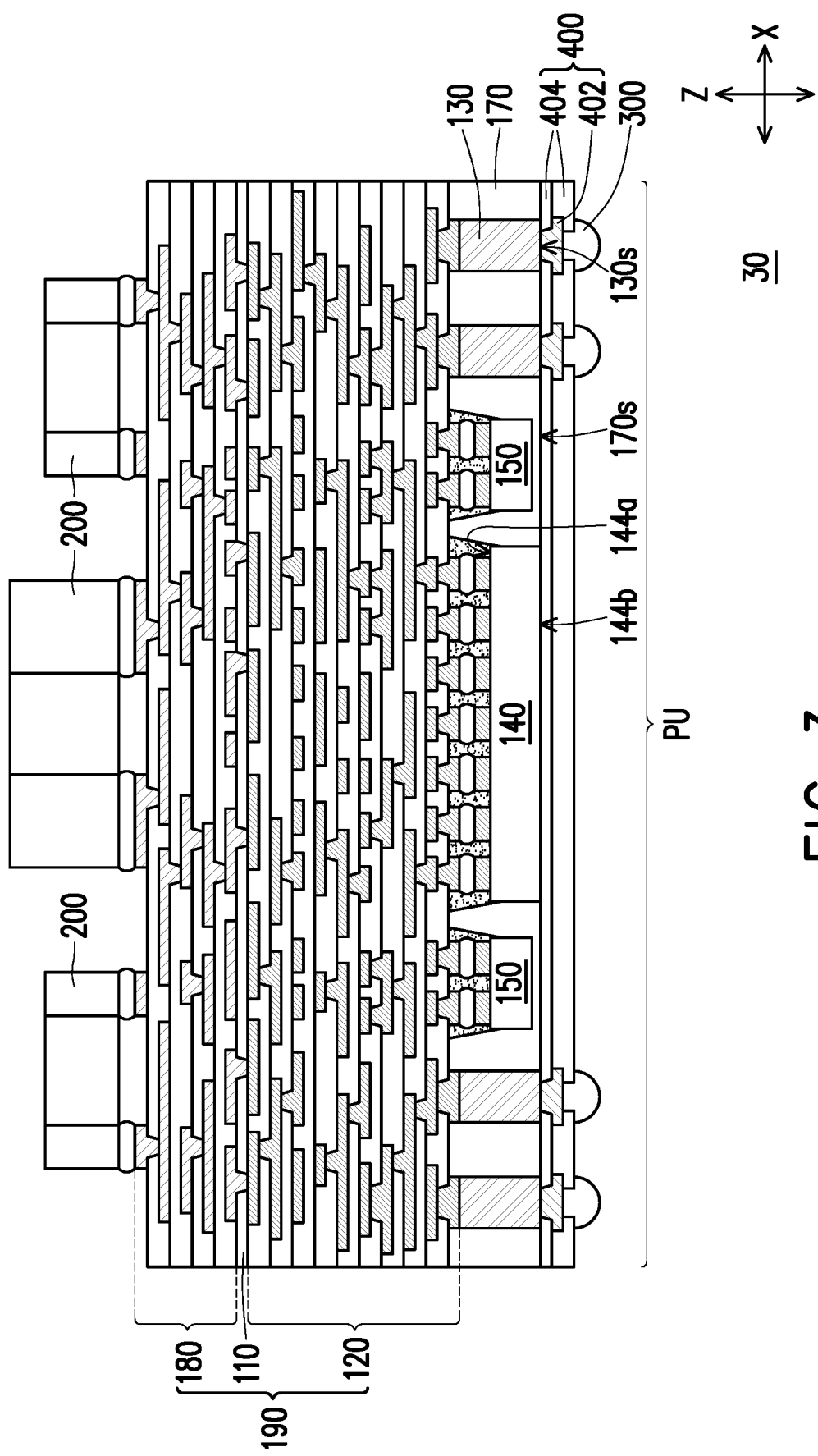
FIG. 3 is a schematic cross-sectional view of a semiconductor package in accordance with some alternative embodiments of the disclosure.

FIG. 3 is a schematic cross-sectional view of a semiconductor package in accordance with some alternative embodiments of the disclosure. The semiconductor package 30 illustrated in FIG. 3 is similar to the semiconductor package 20 illustrated in FIG. 2, hence the same reference numerals are used to refer to the same or liked parts, and its detailed description will be omitted herein. The differences between the semiconductor package 30 illustrated in FIG. 3 and the semiconductor package 20 illustrated in FIG. 2 will be described below.

Referring to FIG. 3, another redistribution structure 400 is included in the package structure 30. In some embodiments, as shown in FIG. 3, the redistribution structure 400 is in physical and direct contact with the surface 170s (illustrated as the bottom surface in FIG. 3) of the encapsulant 170 and the surfaces 130s (illustrated as the bottom surface in FIG. 3) of the conductive connectors 130. That is to say, the redistribution structure 400 and the redistribution structure 190 are respectively disposed on two opposite surfaces of the encapsulant 170 and one two opposite surfaces of the conductive connector 130. In other words, the redistribution structure 400 is disposed opposite to the redistribution structure 190. From another point of view, as shown in FIG. 3, the redistribution structure 400 is in physical and direct contact with the rear surface 144b (illustrated as the bottom surface in FIG. 3) of the semiconductor die 140, and the active surface 144a (illustrated as the top surface in FIG. 3) of the semiconductor die 140 faces the redistribution structure 190, therefore in some embodiments, the redistribution structure 400 is referred to as a back-side redistribution structure, and the redistribution structure 190 is referred as a front-side redistribution structure.

In some embodiments, as shown in FIG. 3, the formation of the redistribution structure 400 includes sequentially forming one or more dielectric layers 404 and one or more redistribution layers 402 in alternation. Although FIG. 3 illustrates that the redistribution structure 400 includes two dielectric layers 404 and one redistribution layer 402, where the redistribution layer 402 is sandwiched between the dielectric layers 404, the disclosure is not limited thereto. In other embodiments, the number of the dielectric layers 404 and the number of the redistribution layer 402 may be adjusted based on product requirement. In some embodiments, the conductive connectors 130 are electrically connected with the redistribution layer 402 of the redistribution structure 400. That is to say, in the package structure 30, the conductive connectors 130 are used to provide electrical connections between the redistribution structure 400 and the redistribution structure 190. In some embodiments, the materials of the dielectric layer 404 and the redistribution layer 402 of the redistribution structure 400 is similar to the materials of the dielectric layer 124 and the redistribution layer 122 mentioned for the redistribution structure 120. Therefore, the detailed descriptions of the dielectric layer 404 and the redistribution layer 402 will be omitted herein. Furthermore, the conductive terminals 300 are electrically connected with the redistribution layer 402 of the redistribution structure 400. As shown in FIG. 3, the conductive terminals 300 are disposed in openings in the dielectric layer 404 of the redistribution structure 400 to be electrically and mechanically coupled to the redistribution layer 402 of the redistribution structure 400. That is to say, the conductive terminals 300 are electrically connected with the conductive connectors 130 through the redistribution layer 402 of the redistribution structure 400.

In accordance with some embodiments of the present disclosure, a semiconductor package includes a semiconductor die, an encapsulant and a redistribution structure. The encapsulant laterally encapsulates the semiconductor die.

The redistribution structure is disposed on the encapsulant and electrically connected with the semiconductor die, wherein the redistribution structure comprises a first conductive via, a first conductive wiring layer and a second conductive via stacked along a stacking direction, the first conductive via has a first terminal surface contacting the first conductive wiring layer, the second conductive via has a second terminal surface contacting the first conductive wiring layer, an area of a first cross section of the first conductive via is greater than an area of the first terminal surface of the first conductive via, and an area of a second cross section of the second conductive via is greater than an area of the second terminal surface of the second conductive via.

In accordance with alternative embodiments of the present disclosure, a semiconductor package includes a semiconductor die, an encapsulant and a first redistribution structure. The encapsulant laterally encapsulates the semiconductor die. The first redistribution structure is stacked on the encapsulant along a stacking direction and electrically connected with the semiconductor die, wherein the first redistribution structure comprises a first conductive via and a second conductive via stacked on the first conductive via along the stacking direction, a lateral dimension of the first conductive via decreases along a first direction, a lateral dimensions of the second conductive via decreases along a second direction, the first direction is opposite to the second direction, and the first direction and the second direction are parallel to the stacking direction.

In accordance with yet alternative embodiments of the present disclosure, a method of manufacturing a semiconductor package includes the following steps. A package structure is provided, and the package structure includes a plurality of first dies, a first redistribution structure is formed. A semiconductor die mounted on the first redistribution structure is laterally encapsulated by an encapsulant. A second redistribution structure is formed on the first redistribution structure, wherein the first redistribution structure is located between the semiconductor die and the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die;
   an encapsulant laterally encapsulating the semiconductor die; and
   a redistribution structure disposed on the encapsulant along a stacking direction and electrically connected with the semiconductor die, wherein the redistribution structure comprises a first conductive via, a first conductive wire, and a second conductive via arranged along the stacking direction, the first conductive via has a first via surface contacting the first conductive wire, the second conductive via has a second via surface contacting the first conductive wire, an area of a first cross section of the first conductive via is greater than an area of the first via surface of the first conductive via, and an area of a second cross section of the second conductive via is greater than an area of the second via surface of the second conductive via, and wherein the redistribution structure further comprises a first dielectric layer and a second dielectric layer, the first dielectric layer wraps around the first conductive via and the first conductive wire, the second dielectric layer wraps around the second conductive via, and the first conductive via is nearer to the semiconductor die than the second conductive via.

2. The semiconductor package according to claim 1, wherein the redistribution structure further comprises a second conductive wire and a third conductive wire, the second conductive wire is disposed on a first surface of the first dielectric layer, and the third conductive wire is disposed on a second surface of the second dielectric layer.

3. The semiconductor package according to claim 2, wherein the first cross section of the first conductive via is coplanar with the first surface of the first dielectric layer, and the second cross section of the second conductive via is coplanar with the second surface of the second dielectric layer.

4. The semiconductor package according to claim 1, wherein the redistribution structure comprises a first portion and a second portion stacked on the first portion, the first portion of the redistribution structure comprises the first conductive via, and the second portion of the redistribution structure comprises the second conductive via.

5. The semiconductor package according to claim 1, further comprising conductive connectors laterally encapsulated by the encapsulant and electrically connected with the redistribution structure, wherein the semiconductor die is electrically connected with the redistribution structure through bump joints, and the semiconductor die is surrounded by the conductive connectors.

6. The semiconductor package according to claim 5, further comprising conductive terminals electrically connected with the conductive connectors, wherein the conductive connectors are disposed between the redistribution structure and the conductive terminals.

7. A semiconductor package, comprising:
   a semiconductor die;
   an encapsulant laterally encapsulating the semiconductor die; and
   a first redistribution structure stacked on the encapsulant along a stacking direction and electrically connected with the semiconductor die, wherein the first redistribution structure comprises a first conductive via and a second conductive via disposed over the first conductive via along the stacking direction, a lateral dimension of the first conductive via decreases along a first direction, a lateral dimensions of the second conductive via decreases along a second direction, the first direction is opposite to the second direction, and the first direction and the second direction are parallel to the stacking direction, and wherein the encapsulant is not on sidewalls of the first redistribution structure, and wherein the first redistribution structure further comprises first conductive wires, second conductive wires, third conductive wires and fourth conductive wires, the first conductive via is located between and in direct contact with the first conductive wires and the second conductive wires, the second conductive via is located between and in direct contact with the third conductive wires and the fourth conductive wires, the first conductive wires, the first conductive via, the second conductive wires, the third conductive wires, the second conductive via and the fourth conductive wires are sequentially disposed along the stacking direction, a first contact area between the first conductive via and the first conductive wires is greater than a second contact area between the first conductive via and the second conductive wires, and a third contact area between the second conductive via and the third conductive wires is smaller than a fourth contact area between the second conductive via and the fourth conductive wires.

8. The semiconductor package according to claim 7, wherein a ratio of the first contact area to the second contact area ranges from 1.2 to 1.8, a ratio of the fourth contact area to the third contact area ranges from 1.2 to 1.8.

9. The semiconductor package according to claim 7, wherein a pitch of the first conductive wires is different from a pitch of the second conductive wires.

10. The semiconductor package according to claim 7, wherein the first redistribution structure comprises a first portion and a second portion in direct contact with the first portion, the first portion of the first redistribution structure comprises the first conductive via, and the second portion of the first redistribution structure comprises the second conductive via.

11. The semiconductor package according to claim 7, further comprising conductive connectors laterally encapsulated by the encapsulant and in contact with the first redistribution structure.

12. The semiconductor package according to claim 11, further comprising conductive terminals electrically connected with the conductive connectors, wherein the conductive terminals and the first redistribution structure are located at opposite sides of each of the conductive connectors.

13. The semiconductor package according to claim 12, further comprising a second redistribution structure disposed on the encapsulant and opposite to the first redistribution structure, wherein the second redistribution structure is electrically connected between the conductive connectors and the conductive terminals.

14. A method of manufacturing a semiconductor package, comprising:
forming a first redistribution structure;
laterally encapsulating a semiconductor die mounted on the first redistribution structure by an encapsulant; and
forming a second redistribution structure on the first redistribution structure along a stacking direction, wherein the first redistribution structure is located between the semiconductor die and the second redistribution structure, and wherein the first redistribution structure comprises a first conductive via and the second redistribution structure comprises a second conductive via disposed over the first conductive via along the stacking direction, a lateral dimension of the first conductive via decreases along a first direction, a lateral dimensions of the second conductive via decreases along a second direction, the first direction is opposite to the second direction, and the first direction and the second direction are parallel to the stacking direction, and wherein the encapsulant is not on sidewalls of the first redistribution structure, and wherein the first redistribution structure further comprises first conductive wires and second conductive wires, the second redistribution structure further comprises third conductive wires and fourth conductive wires, the first conductive via is located between and in direct contact with the first conductive wires and the second conductive wires, the second conductive via is located between and in direct contact with the third conductive wires and the fourth conductive wires, the first conductive wires, the first conductive via, the second conductive wires, the third conductive wires, the second conductive via and the fourth conductive wires are sequentially disposed along the stacking direction, a first contact area between the first conductive via and the first conductive wires is greater than a second contact area between the first conductive via and the second conductive wires, and a third contact area between the second conductive via and the third conductive wires is smaller than a fourth contact area between the second conductive via and the fourth conductive wires.

15. The method according to claim 14, wherein the first redistribution structure comprising 5 to 10 first redistribution layers is formed on a first carrier.

16. The method according to claim 15, further comprising before forming the second redistribution structure:
bonding the semiconductor die and the encapsulant onto a second carrier, wherein the semiconductor die is located between the second carrier and the first redistribution structure; and
removing the first carrier from the first redistribution structure to expose a surface of the first redistribution structure.

17. The method according to claim 16, wherein the second redistribution structure comprising 4 to 10 second redistribution layers is formed on the exposed surface of the first redistribution structure.

18. The method according to claim 15, wherein after forming the second redistribution structure, further comprising:
removing the second carrier from the semiconductor die and the encapsulant; and
performing a singulation process through the second redistribution structure, the first redistribution structure and the encapsulant.

19. The semiconductor package according to claim 2, wherein the second via surface of the second conductive via is coplanar with a third surface of the first dielectric layer opposite to the first surface of the first dielectric layer.

20. The semiconductor package according to claim 11, wherein the semiconductor die is electrically connected with the first redistribution structure through bump joints, and the semiconductor die is surrounded by the conductive connectors.

* * * * *